(12) United States Patent
Nishihara et al.

(10) Patent No.: US 10,784,831 B2
(45) Date of Patent: Sep. 22, 2020

(54) OUTPUT POWER CONTROL DEVICE

(71) Applicant: Mitsubishi Electric Corporation, Chiyoda-ku (JP)

(72) Inventors: Jun Nishihara, Chiyoda-ku (JP); Takuo Morimoto, Chiyoda-ku (JP); Hiroyuki Nonomura, Chiyoda-ku (JP); Norihiro Yunoue, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/609,329

(22) PCT Filed: Jul. 4, 2018

(86) PCT No.: PCT/JP2018/025319
§ 371 (c)(1),
(2) Date: Oct. 29, 2019

(87) PCT Pub. No.: WO2019/013062
PCT Pub. Date: Jan. 17, 2019

(65) Prior Publication Data
US 2020/0052669 A1    Feb. 13, 2020

(30) Foreign Application Priority Data

Jul. 11, 2017 (JP) .................. 2017-135439
Aug. 31, 2017 (JP) .................. 2017-167138

(51) Int. Cl.
*H03G 3/30* (2006.01)
*H03F 3/24* (2006.01)
*H03F 3/19* (2006.01)

(52) U.S. Cl.
CPC ............. *H03G 3/3042* (2013.01); *H03F 3/19* (2013.01); *H03F 3/245* (2013.01); *H03F 2200/465* (2013.01)

(58) Field of Classification Search
None
See application file for complete search history.

(56) References Cited

U.S. PATENT DOCUMENTS 4,682,045 A * 7/1987 Amazawa ............. H03G 3/345
                                                      307/106
5,689,815 A   11/1997 Yamazaki et al.
(Continued)

FOREIGN PATENT DOCUMENTS

JP    61-173507 A    8/1986
JP    6-152259 A     5/1994
(Continued)

OTHER PUBLICATIONS

International Search Report dated Jul. 31, 2018 in PCT/JP2018/025319 filed on Jul. 4, 2018.
(Continued)

*Primary Examiner* — Lana N Le
(74) *Attorney, Agent, or Firm* — Oblon, McClelland, Maier & Neustadt, L.L.P.

(57) ABSTRACT

An output power control device includes: an attenuator to attenuate power of a high-frequency signal output from an oscillator; a high-frequency power amplifier to amplify the power of the high-frequency signal output from the attenuator; a monitor circuit to monitor the power of the high-frequency signal output from the high-frequency power amplifier; and a controller to control an attenuation amount of the attenuator based on the monitor signal output from the monitor circuit or based on attenuation amount setting data from a data unit. The oscillator generates the high-frequency signal in synchronization with a trigger signal. The controller starts control of the attenuation amount of the attenuator based on the attenuation amount setting data, in synchronization with the trigger signal, and, after receiving the (Continued)

monitor signal, the controller controls the attenuation amount of the attenuator based on the monitor signal.

10 Claims, 18 Drawing Sheets

(56) References Cited

U.S. PATENT DOCUMENTS

| | | | | |
|---|---|---|---|---|
| 5,809,090 | A * | 9/1998 | Buternowsky | H04B 7/084 340/7.21 |
| 6,172,560 | B1 * | 1/2001 | Yamashita | H03F 1/3235 330/151 |
| 7,079,604 | B1 * | 7/2006 | Miller | H04B 1/7183 370/514 |
| 7,231,191 | B2 * | 6/2007 | Posner | H03F 1/3229 455/114.3 |
| 8,461,842 | B2 * | 6/2013 | Thuringer | H03F 1/3282 324/318 |
| 2005/0225846 | A1 * | 10/2005 | Nati | H01S 3/1112 359/341.1 |
| 2010/0329364 | A1 * | 12/2010 | Giombanco | H04B 1/16 375/258 |
| 2019/0280665 | A1 * | 9/2019 | Nonomura | H03G 3/3047 |

FOREIGN PATENT DOCUMENTS

| | | |
|---|---|---|
| JP | 3498773 B2 | 2/2004 |
| JP | 2006-333161 A | 12/2006 |
| JP | 2012-178624 A | 9/2012 |
| WO | WO 2018/096919 A1 | 5/2018 |

OTHER PUBLICATIONS

Japanese Office Action dated Dec. 10, 2018 in Japanese Patent Application No. 2018-546563 (with unedited computer-generated English translation), 5 pages.

Japanese Office Action dated Apr. 16, 2019 in Japanese Patent Application No. 2018-546563 (with unedited computer-generated English translation), 6 pages.

* cited by examiner (a)

TRIGGER SIGNAL CHARACTERISTIC (b)

OUTPUT POWER CHARACTERISTIC OF OSCILLATOR (c)

ATTENUATION AMOUNT CHARACTERISTIC (a)

INPUT POWER CHARACTERISTIC OF AMPLIFIER (b)

GAIN CHARACTERISTIC OF AMPLIFIER (c)

OUTPUT POWER CHARACTERISTIC OF AMPLIFIER (a)

INPUT POWER CHARACTERISTIC OF AMPLIFIER (b)

GAIN CHARACTERISTIC OF AMPLIFIER (c)

OUTPUT POWER CHARACTERISTIC OF AMPLIFIER (a)

INPUT POWER CHARACTERISTIC OF AMPLIFIER (b)

GAIN CHARACTERISTIC OF AMPLIFIER (c)

OUTPUT POWER CHARACTERISTIC OF AMPLIFIER (a)

TRIGGER SIGNAL CHARACTERISTIC (b)

OUTPUT POWER CHARACTERISTIC OF OSCILLATOR (c)

GAIN CHARACTERISTIC OF AMPLIFIER (d)

ATTENUATION AMOUNT CHARACTERISTIC (a)

INPUT POWER CHARACTERISTIC OF AMPLIFIER (b)

OUTPUT POWER CHARACTERISTIC OF AMPLIFIER

OUTPUT POWER CONTROL DEVICE

TECHNICAL FIELD

The present invention relates to an output power control device which maintains output power of a high-frequency signal to be output from a high-frequency power amplifier, to be constant.

BACKGROUND ART

In a transmission device used for communication, radar, and the like, it is desired that output power of a high-frequency signal to be transmitted is constant, in order to avoid deterioration of communication quality in performing high-speed communication, or in order to perform accurate detection. However, in a high-frequency power amplifier used for a transmission device, gain fluctuates due to changes in voltage applied to the high-frequency power amplifier during operation or changes in heat caused by heat generation in the high-frequency power amplifier, and output power fluctuates as a result. Such output fluctuation is particularly significant when an output of the high-frequency signal rises, including when pulse operation is performed. In a section (time) where an amplitude of the output power fluctuates greatly when the output power rises, or where an amplitude of the output power fluctuates greatly within a pulse when the pulse operation is performed, communication quality and detection accuracy are affected. Thus, the section (time) is often handled as a "dead time" in which transmission of the high-frequency signal is not performed.

However, when the dead time is set long to improve communication quality and detection accuracy, it leads to wasted power consumption and increased heat generation amount, and it leads to increased cost and size of the transmission device itself or increased operation cost.

Concerning voltage fluctuation, it occurs when current supply from a power supply is insufficient relative to an inrush current to the high-frequency power amplifier or a peak current of the high-frequency power amplifier when the pulse operation is performed. In response thereto, countermeasures can be taken by increasing current supply capacity of the power supply or providing a capacitor bank.

On the other hand, concerning fluctuation due to heat, specifically, when power of the high-frequency signal is amplified using a semiconductor transistor made of Si, GaN, GaAs, or the like, the semiconductor transistor generates heat, and generally, gain of the semiconductor transistor decreases due to this heat generation. From when the output power rises to when the temperature of the high-frequency power amplifier including the semiconductor transistor is stabilized, there occurs a phenomenon in which the output power of the high-frequency power amplifier gradually decreases as the gain of the high-frequency power amplifier decreases. Although this fluctuation occurs significantly for initial several microseconds to several tens of microseconds when the output power of the high-frequency signal rises, including when the pulse operation is performed, it is extremely difficult to compensate for the fluctuation in that period by directly changing temperature from outside.

Therefore, as a technique for maintaining output power of a power amplifier to be constant, there is disclosed an automatic level control (ALC) circuit including a detection means configured to detect the output power and generate a direct current (DC) voltage according to an output level thereof, and a means configured to control an attenuation means provided to a system based on an output voltage of the detection means, characterized in that these means constitute a negative feedback loop to set the output level to be constant (see PTL 1).

CITATION LIST

Patent Literature

PTL 1: Japanese Patent Laying-Open No. 61-173507

SUMMARY OF INVENTION

Technical Problem

In the ALC circuit described in PTL 1, for initial several microseconds to several tens of microseconds when a high-frequency signal rises after being input to the power amplifier, the output power changes greatly, and thus particularly fine control is required. However, until the negative feedback loop becomes effective, a time difference occurs due to a delay caused by components such as a converter, and computation. Accordingly, when the output power of the power amplifier rises, the output power cannot be controlled for a certain period, and the output power cannot be set to a desired value. Although it is possible to decrease a delay time by selecting a converter and a computation circuit capable of performing high-speed processing, it leads to increased component cost.

The present invention has been made to solve the aforementioned problem, and an object thereof is to obtain an output power control device configured to output stable output power from when output power of a high-frequency power amplifier rises.

Solution to Problem

An output power control device in accordance with the present invention includes an attenuator to attenuate and output power of a high-frequency signal having a pulse waveform output from an oscillator; a high-frequency power amplifier to amplify and output the power of the high-frequency signal output from the attenuator; a monitor circuit to monitor the power of the high-frequency signal output from the high-frequency power amplifier, and output a monitor signal according to magnitude of the power of the high-frequency signal; and a controller to control an attenuation amount of the attenuator based on the monitor signal output from the monitor circuit or based on attenuation amount setting data from a data unit. The oscillator generates the high-frequency signal having the pulse waveform in synchronization with a trigger signal. The controller starts control of the attenuation amount of the attenuator using an attenuation amount control signal generated based on the attenuation amount setting data, in synchronization with the trigger signal, and, after receiving the monitor signal, the controller controls the attenuation amount of the attenuator using the attenuation amount control signal generated based on the monitor signal.

Advantageous Effects of Invention

According to the present invention, an output power control device configured to output stable output power from when output power of a high-frequency power amplifier rises is obtained.

DESCRIPTION OF EMBODIMENTS

First Embodiment

Figure 1:
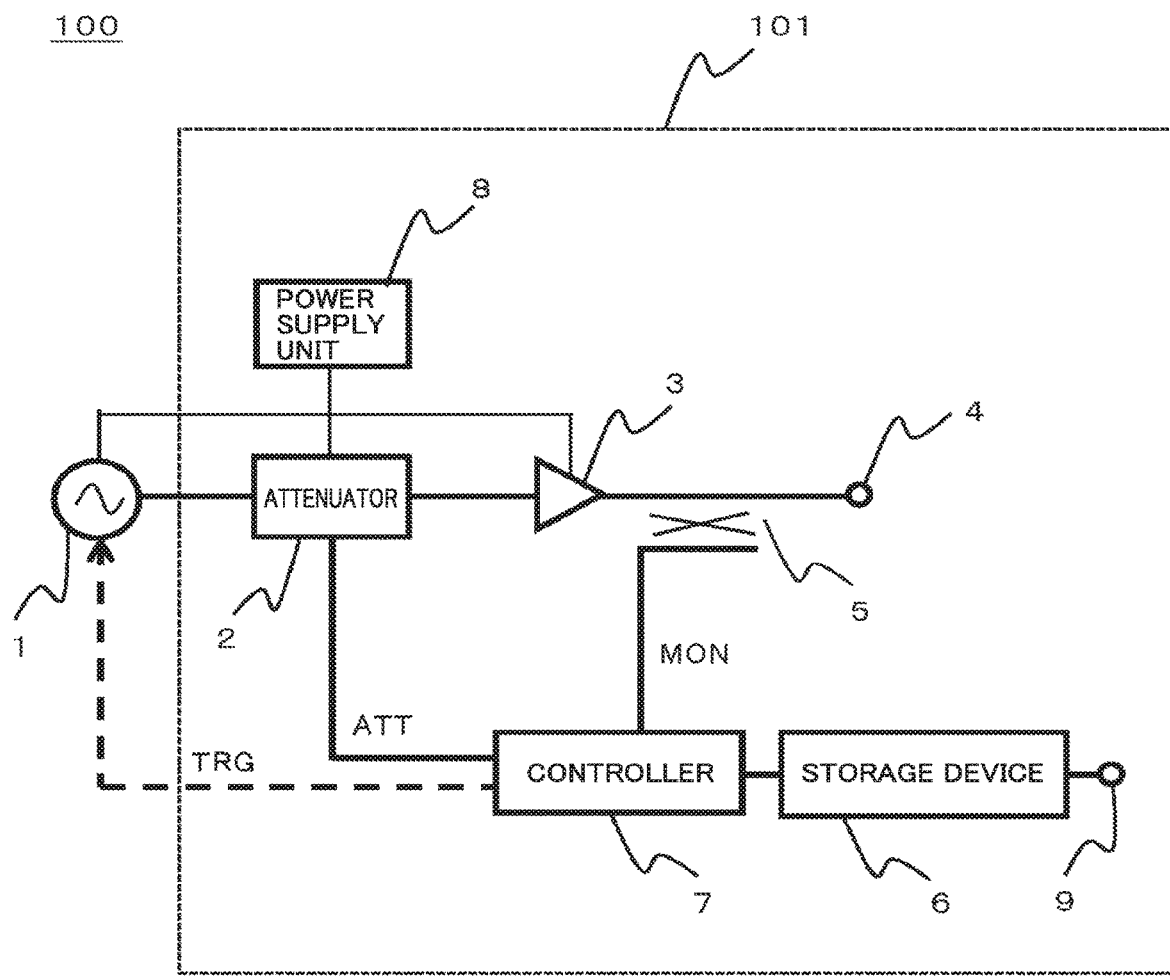
FIG. 1 is a block diagram of a transmission device including an output power control device in accordance with a first embodiment of the present invention.

An output power control device in accordance with a first embodiment of the present invention is described. FIG. 1 is a block diagram of a transmission device including the output power control device in accordance with the first embodiment of the present invention.

A transmission device 100 includes an oscillator 1 and an output power control device 101. Output power control device 101 includes an attenuator 2 configured to attenuate and output power of a high-frequency signal having a pulse waveform output from oscillator 1, a high-frequency power amplifier 3 configured to amplify and output the power of the high-frequency signal output from attenuator 2, and a monitor circuit 5 configured to monitor the power of the high-frequency signal output from high-frequency power amplifier 3 and output the high-frequency signal from an output terminal 4, and also output a monitor signal MON according to the magnitude of the power of the high-frequency signal. High-frequency power amplifier 3 is constituted using a semiconductor transistor made of Si, GaN, GaAs, or the like, for example. Monitor circuit 5 is constituted of a coupler and a detection diode, and outputs a voltage obtained by detecting, by the detection diode, the high-frequency signal extracted by the coupler, as monitor signal MON.

Output power control device 101 includes a controller 7 configured to control an attenuation amount of attenuator 2 based on monitor signal MON output from monitor circuit 5 or based on an attenuation amount setting table stored in a storage device 6. From controller 7, a trigger signal TRG for causing oscillator 1 to operate in synchronization with attenuator 2 is input to oscillator 1. It should be noted that the transmission device includes a power supply unit 8 configured to provide power supply to oscillator 1, attenuator 2, and high-frequency power amplifier 3. It should be noted that storage device 6 is also referred to as a data unit. In addition, the attenuation amount setting table is also referred to as attenuation amount setting data.

Operation of transmission device 100 is described. During ordinary operation, and in a stable pulse waveform section during pulse operation, that is, in a section where power which fluctuates during a delay time caused by components such as a converter constituting monitor circuit 5 and controller 7 and computation is smaller than a difference in acceptable range of predetermined power, the power of the high-frequency signal when monitored by monitor circuit 5 is substantially equal to the level of power of the high-frequency signal when an attenuation amount control signal ATT reaches attenuator 2. Thus, controller 7 generates attenuation amount control signal ATT for attenuator 2 based on monitor signal MON output from monitor circuit 5, to control the attenuation amount of attenuator 2, thereby controlling the power of the high-frequency signal to be output from high-frequency power amplifier 3 such that it is output at the predetermined power. Transmission device 100 can perform such ALC operation.

Next, operation of transmission device 100 in a rising section during the pulse operation is described. Controller 7 generates trigger signal TRG, and transmits trigger signal TRG to oscillator 1. Oscillator 1 generates and outputs the high-frequency signal having the pulse waveform in synchronization with received trigger signal TRG. The high-frequency signal is input to attenuator 2, and the attenuated signal is input to high-frequency power amplifier 3 and subjected to high-frequency power amplification, and then output therefrom. The attenuation amount of attenuator 2 is adjusted such that power of the high-frequency signal which is output from output terminal 4 is output at desired power.

However, due to components such as a converter constituting monitor circuit 5 and controller 7, and computation, a delay occurs in generation of attenuation amount control signal ATT for attenuator 2 which is generated based on monitor signal MON output from monitor circuit 5. In the rising section, power fluctuates greatly over time, and thus the level of the power of the high-frequency signal when monitored by monitor circuit 5 is significantly different from the level of the power of the high-frequency signal when attenuation amount control signal ATT reaches attenuator 2. It results in overcompensation or undercompensation, and the power cannot be set to the desired power. Accordingly, in the section where the high-frequency signal rises, controller 7 starts control of the attenuation amount of attenuator 2 by generating attenuation amount control signal ATT based on the attenuation amount setting table stored beforehand in storage device 6, and outputting attenuation amount control signal ATT to attenuator 2 in synchronization with trigger signal TRG generated by itself. The attenuation amount of attenuator 2 is adjusted based on attenuation amount control signal ATT, the high-frequency signal output from attenuator 2 is input to high-frequency power amplifier 3 and subjected to high-frequency power amplification, and the high-frequency signal to be output from high-frequency power amplifier 3 is output at the desired power. In this manner, the output power of the high-frequency signal in the rising section is controlled to desired output power.

The attenuation amount setting table is data in which the attenuation amount is set to output the desired power from high-frequency power amplifier 3 by measuring beforehand power reduction (droop) caused by a change in temperature of high-frequency power amplifier 3, and compensating for the power reduction. For example, in the attenuation amount setting table, the attenuation amount is set to be large when high-frequency power amplifier 3 has a low temperature, and the attenuation amount is set to be small when high-frequency power amplifier 3 has a high temperature. As the attenuation amount setting table, a plurality of tables are stored in storage device 6, corresponding to a pulse condition and an input power condition of the high-frequency signal to be input to high-frequency power amplifier 3, a temperature condition of high-frequency power amplifier 3, and the like.

Here, storage device 6 receives an external condition, such as the pulse condition and the input power condition of the high-frequency signal to be controlled, from an input terminal 9, selects an attenuation amount setting table for a power compensation condition corresponding to the external condition, and outputs the attenuation amount setting table to controller 7.

Then, when the delay time caused by components such as a converter constituting monitor circuit 5 and controller 7 and computation has elapsed, and it becomes possible to control the attenuation amount of attenuator 2 by the ALC operation based on monitor signal MON, controller 7 switches from control of the attenuation amount of attenuator 2 based on the attenuation amount setting table stored in storage device 6, to control of the attenuation amount of attenuator 2 by the ALC operation based on monitor signal MON, and the output power of high-frequency power amplifier 3 is controlled to desired output power. It should be noted that the desired output power of the high-frequency signal controlled in the rising section is the same as the desired output power of the high-frequency signal controlled by the ALC operation.

Figure 2:
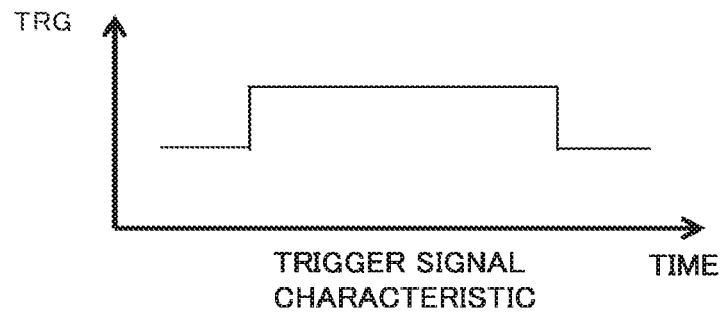
FIG. 2 is a timing chart from an oscillator to an attenuator of the transmission device in accordance with the first embodiment of the present invention.
Figure 2:
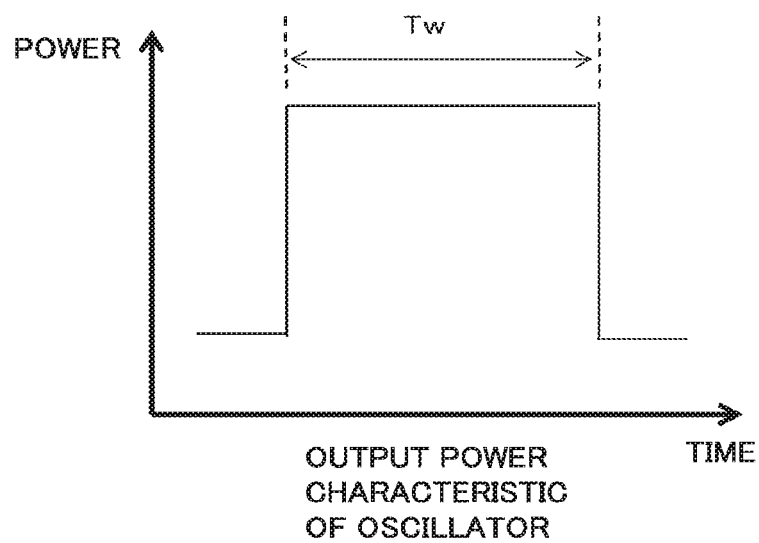
Figure 2:
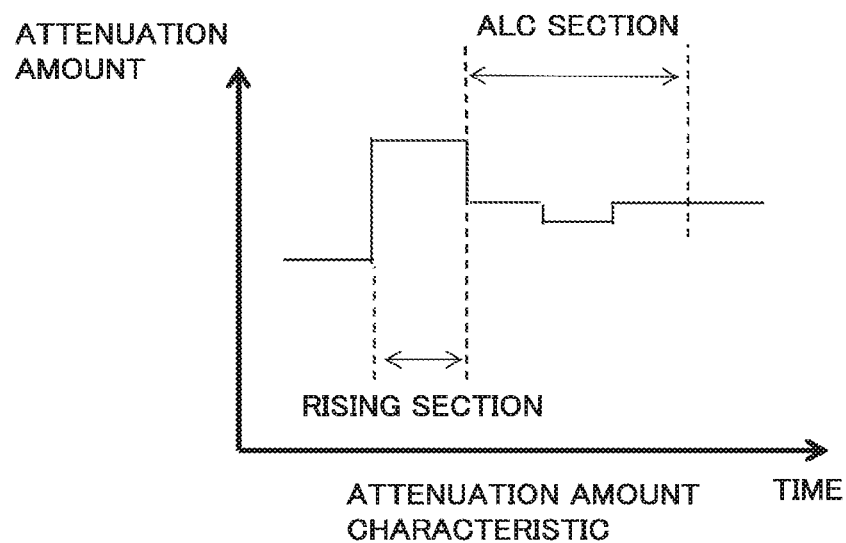

The above operation is described using the drawings. FIG. 2 is a timing chart from oscillator 1 to attenuator 2 of the transmission device in accordance with the first embodiment of the present invention.

In FIG. 2, oscillator 1 generates the high-frequency signal in synchronization with trigger signal TRG. Controller 7 starts control of the attenuation amount of attenuator 2 based on the attenuation amount setting table stored in storage device 6 in synchronization with trigger signal TRG, and the attenuation amount of attenuator 2 shown in a rising section shown in FIG. 2 is set. From attenuator 2, the high-frequency signal having power attenuated by attenuator 2 is output. It should be noted that the attenuation amount of attenuator 2 in the rising section is set by estimating the power reduction (droop) caused by a change in temperature of high-frequency power amplifier 3 from the output power and the pulse condition, and the attenuation amount in the rising section is set to be large.

Since the ALC operation is performed in a stable section after the rising section, the attenuation amount of attenuator 2 changes periodically in the ALC operation section (stable section).

Figure 3:
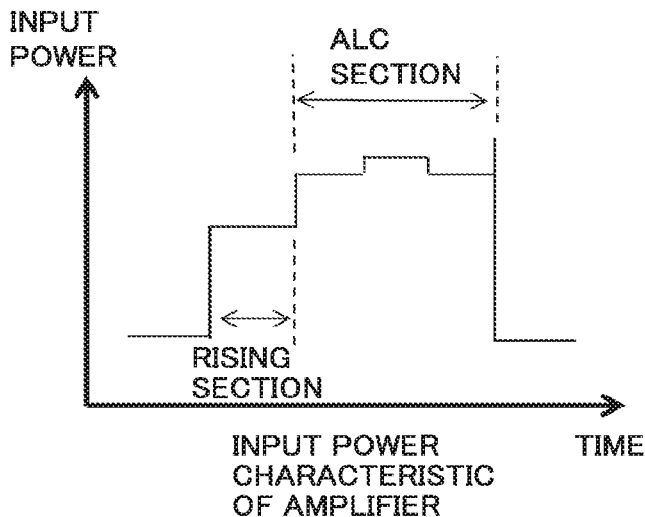
FIG. 3 is a timing chart from an input of a high-frequency power amplifier to an output terminal of a monitor circuit of the transmission device in the first embodiment in accordance with the present invention.
Figure 3:
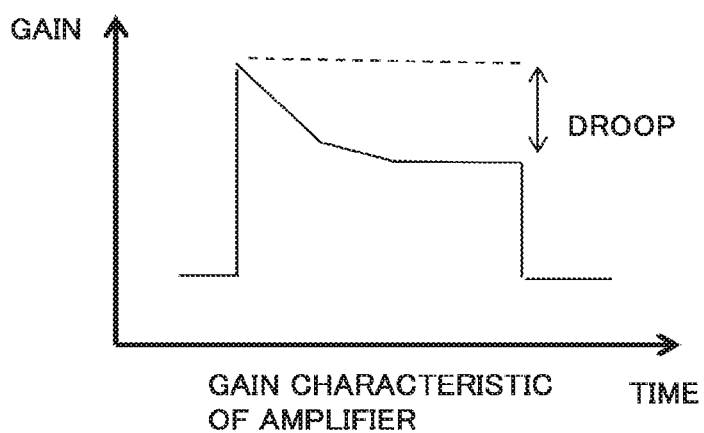
Figure 3:
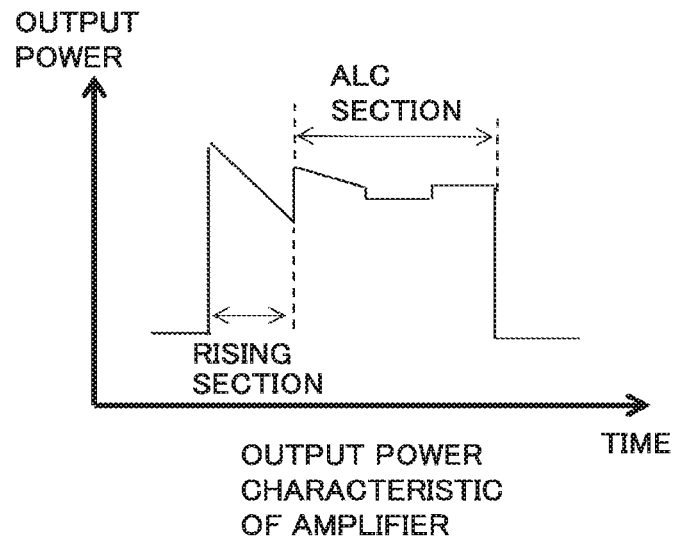

FIG. 3 is a timing chart from an output of attenuator 2, that is, an input of high-frequency power amplifier 3, to the output terminal of monitor circuit 5 of transmission device 100 in accordance with the first embodiment of the present invention.

By estimating the power reduction (droop) caused by a change in temperature of high-frequency power amplifier 3 from the output power and the pulse condition, input power of high-frequency amplifier 3 in a rising section has a suppressed power level. Since the ALC operation is performed in a stable section after the rising section, the input power of high-frequency amplifier 3 changes periodically in the ALC operation section.

Since this input power is input to high-frequency power amplifier 3 having a gain characteristic shown in FIG. 3, the output power of high-frequency power amplifier 3 is maintained at a desired value in both the rising section and the stable section for the ALC operation.

Thus, in the first embodiment, since control of the attenuation amount of attenuator 2 is performed based on the attenuation amount setting table stored beforehand in storage device 6 in the section where the high-frequency signal rises, desired stable output power is obtained from high-frequency power amplifier 3 before a shift to the ALC operation. That is, desired stable output power is obtained from high-frequency power amplifier 3 from immediately after the high-frequency signal is generated by oscillator 1.

Figure 4:
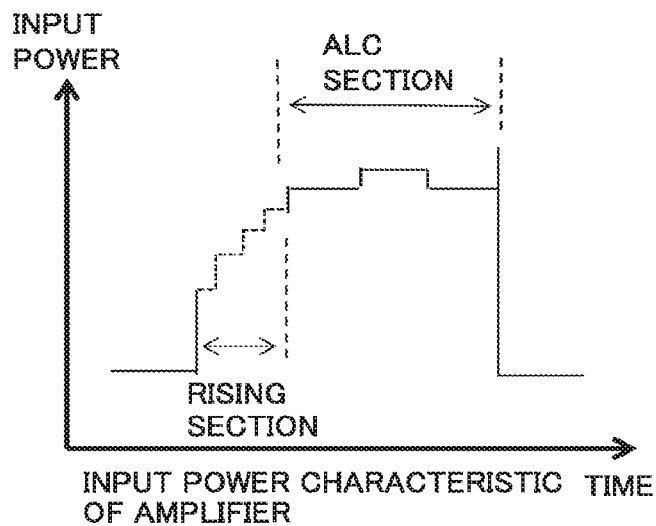
FIG. 4 is another example of the timing chart from the input of the high-frequency power amplifier to the output terminal of the monitor circuit of the transmission device in the first embodiment in accordance with the present invention.
Figure 4:
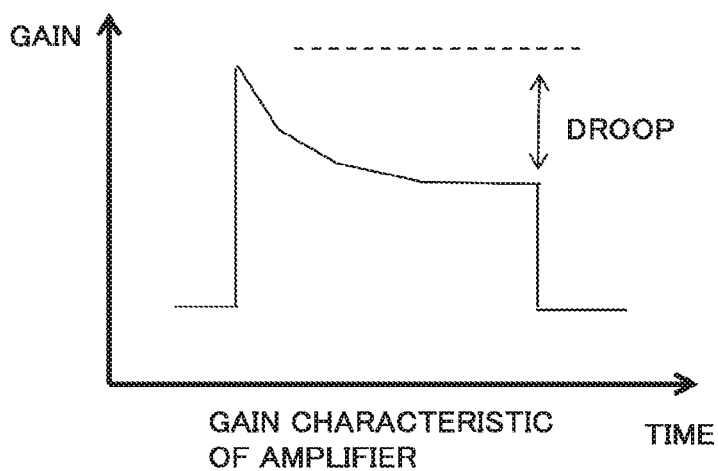
Figure 4:
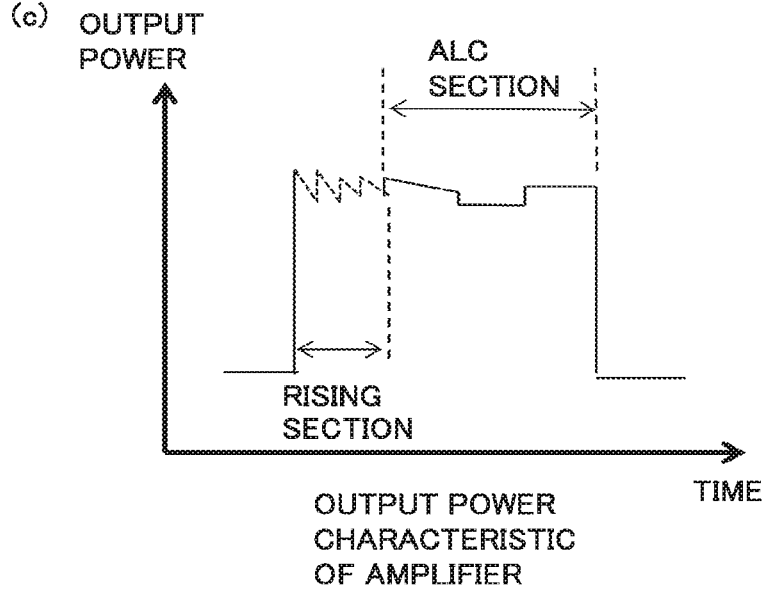

In FIG. 3, the input power from attenuator 2 in the rising section is constant until the shift to the ALC operation section. That is, the attenuation amount of attenuator 2 in the rising section has a constant value. Alternatively, the input power of the high-frequency signal from attenuator 2 in the rising section may change digitally until the shift to the ALC operation section, as shown in FIG. 4. That is, the attenuation amount of attenuator 2 in the rising section may change digitally.

Here, whether to set the attenuation amount of attenuator 2 in the rising section to a constant value or a value which changes discretely is input from input terminal 9 to controller 7 through storage device 6, and controller 7 reads a corresponding attenuation amount setting table from storage device 6.

Figure 5:
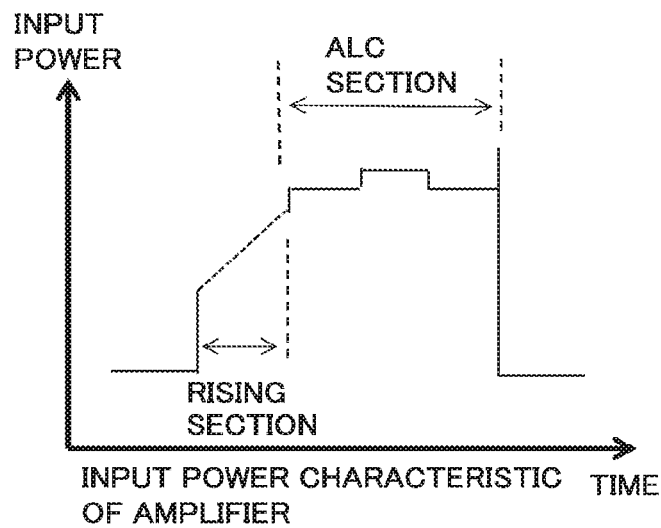
FIG. 5 is another example of the timing chart from the input of the high-frequency power amplifier to the output terminal of the monitor circuit of the transmission device in the first embodiment in accordance with the present invention.
Figure 5:
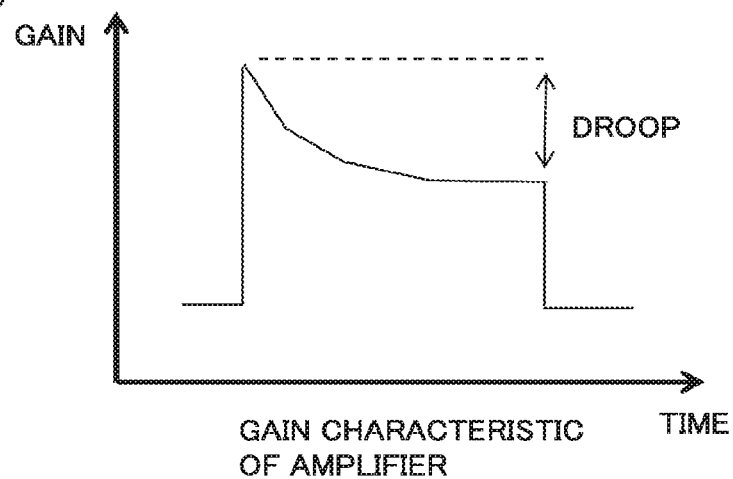
Figure 5:
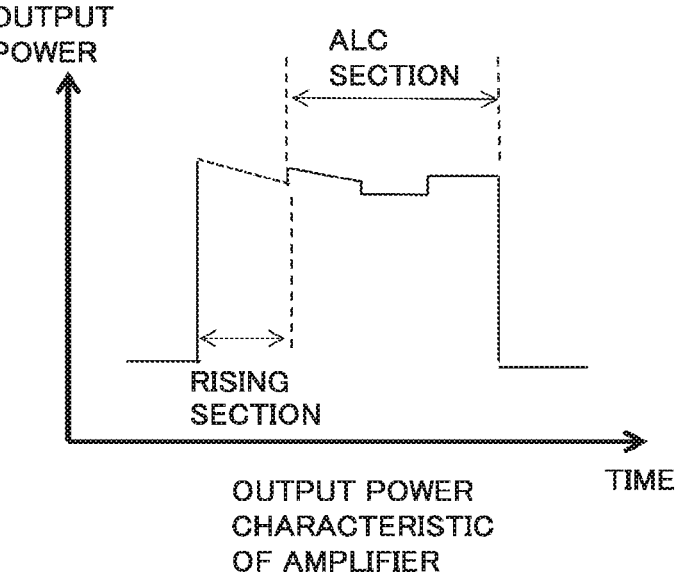

Further, attenuator 2 may be constituted of an analog attenuator, and the input power from attenuator 2 in the rising section may change continuously until the shift to the ALC operation section, as shown in FIG. 5. That is, the attenuation amount of attenuator 2 in the rising section may change continuously.

Figure 6:
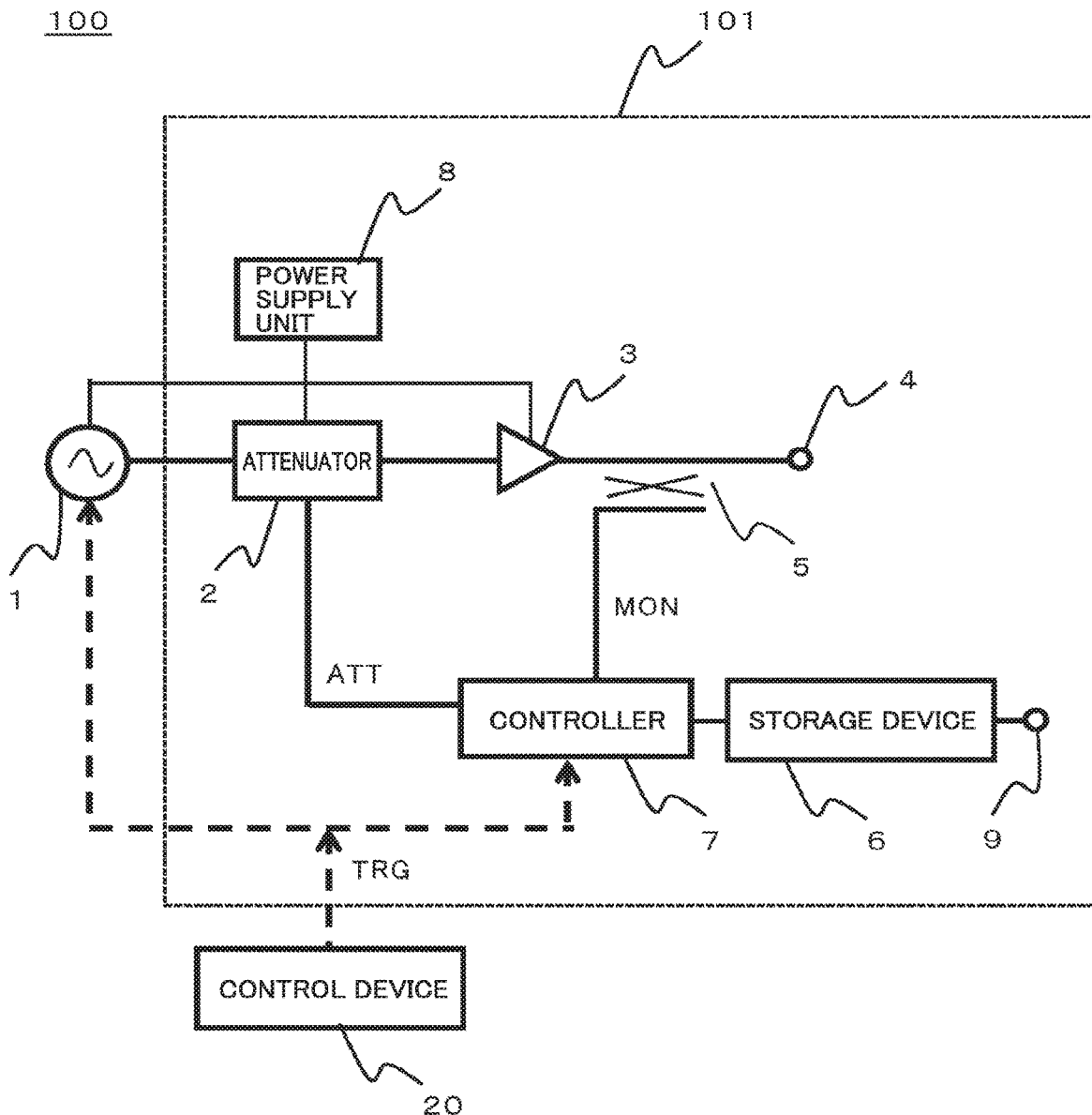
FIG. 6 is a block diagram of a variation of the transmission device including the output power control device in accordance with the first embodiment of the present invention.

The first embodiment has described an example in which trigger signal TRG is generated by controller 7. Trigger signal TRG required by oscillator 1 and controller 7 may be configured to be input from an external control device 20 or the like to oscillator 1 and controller 7, as shown in FIG. 6. In this case, oscillator 1 generates and outputs the high-frequency signal having the pulse waveform in synchronization with trigger signal TRG input from outside. Controller 7 starts control of the attenuation amount of attenuator 2 based on the attenuation amount setting table stored in storage device 6, in synchronization with trigger signal TRG input from the outside.

Second Embodiment

Figure 7:
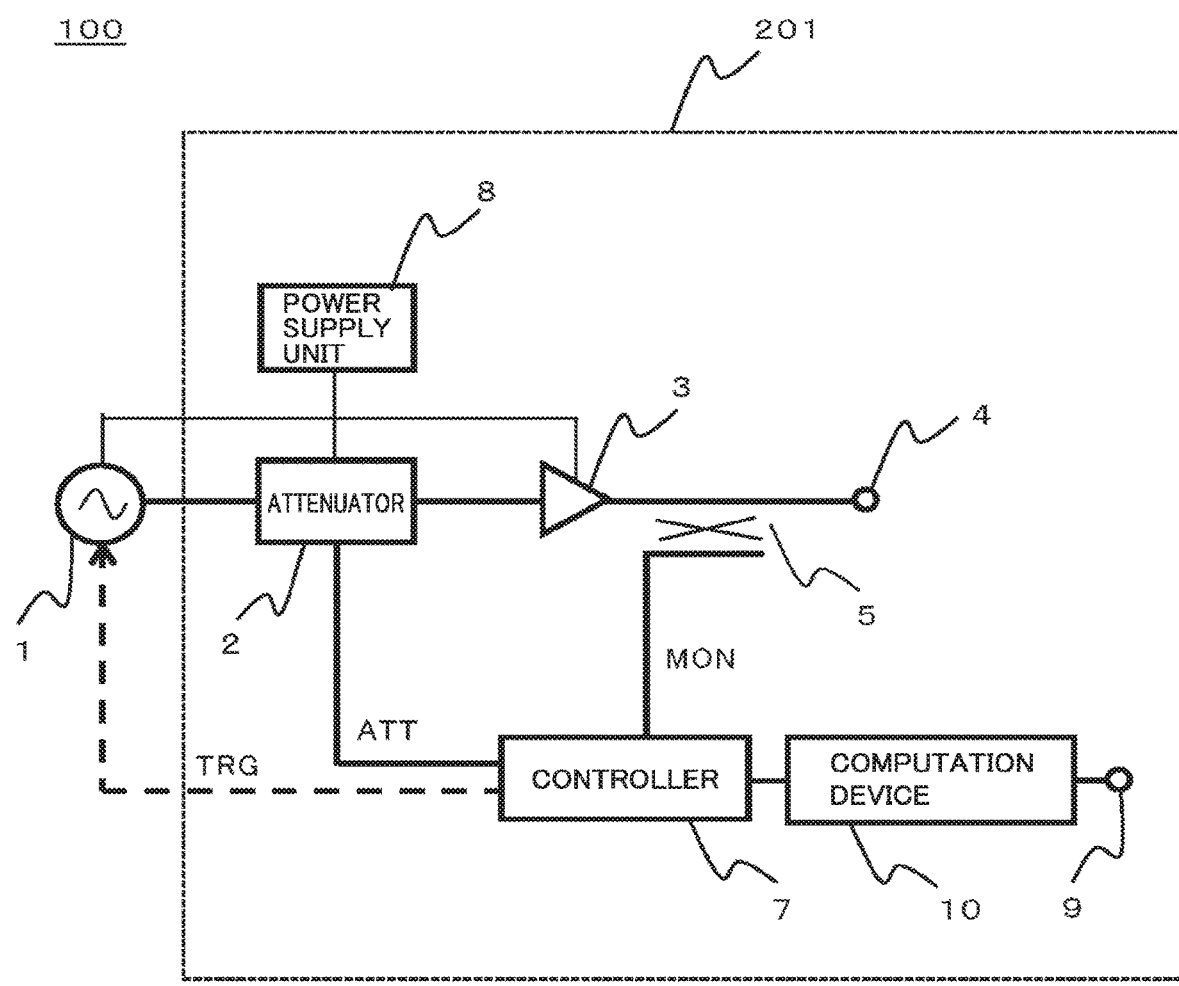
FIG. 7 is a block diagram of a transmission device including an output power control device in accordance with a second embodiment of the present invention.

An output power control device in accordance with a second embodiment of the present invention is described. FIG. 7 is a block diagram of a transmission device including the output power control device in accordance with the second embodiment of the present invention. Components in FIG. 7 which are identical or equal to those in FIG. 1 are designated by the same reference characters, and the description thereof is omitted.

An output power control device 201 in accordance with the second embodiment includes a computation device 10, instead of storage device 6 in output power control device 101 in accordance with the first embodiment. It should be noted that computation device 10 is also referred to a data unit.

Computation device 10 receives, from input terminal 9, a pulse condition and an input power condition of a high-frequency signal to be input to high-frequency power amplifier 3, and an operation condition of high-frequency power amplifier 3 such as an operation temperature. Based on the input operation condition, computation device 10 computes an attenuation amount setting table for a pulse rising section.

Operation of transmission device 100 in a rising section during pulse operation is described. Controller 7 generates trigger signal TRG, and transmits trigger signal TRG to oscillator 1. Oscillator 1 generates and outputs a high-frequency signal having a pulse waveform in synchronization with received trigger signal TRG. The high-frequency signal is input to attenuator 2. The attenuation amount of attenuator 2 is adjusted such that power of the high-frequency signal which is output from attenuator 2, input to high-frequency power amplifier 3 and amplified therein, and then output therefrom is output at desired power.

However, due to components such as a converter constituting monitor circuit 5 and controller 7, and computation, a delay occurs in generation of attenuation amount control signal ATT for attenuator 2 which is generated based on monitor signal MON output from monitor circuit 5. In the rising section, power fluctuates greatly over time, and thus the level of the power of the high-frequency signal when monitored by monitor circuit 5 is significantly different from the level of the power of the high-frequency signal when attenuation amount control signal ATT reaches attenuator 2. It results in overcompensation or undercompensation, and the power cannot be set to the desired power. Accordingly, in the section where the high-frequency signal rises, controller 7 starts control of the attenuation amount of attenuator 2 by generating attenuation amount control signal ATT based on the attenuation amount setting table computed by computation device 10, and outputting attenuation amount control signal ATT to attenuator 2 in synchronization with trigger signal TRG. The attenuation amount of attenuator 2 is adjusted based on attenuation amount control signal ATT, the high-frequency signal output from attenuator 2 is input to high-frequency power amplifier 3 and subjected to high-frequency power amplification, and the high-frequency signal is output at the desired power from high-frequency power amplifier 3. In this manner, the power of the high-frequency signal in the pulse rising section is controlled to the desired power.

Then, when power which fluctuates during a delay time caused by components such as a converter constituting monitor circuit 5 and controller 7 and computation is smaller than a difference in acceptable range of predetermined power, it becomes possible to control the attenuation amount of attenuator 2 by the ALC operation based on monitor signal MON. Then, control of the attenuation amount of attenuator 2 based on the attenuation amount setting table computed and generated by computation device 10 is switched to control of the attenuation amount of attenuator 2 by the ALC operation based on monitor signal MON, and the output power of high-frequency power amplifier 3 is controlled to desired output power. It should be noted that the desired output power of the high-frequency signal controlled in the rising section is the same as the desired output power of the high-frequency signal controlled by the ALC operation.

Input power of the high-frequency signal from attenuator 2 in the rising section may be constant until a shift to an ALC operation section, as shown in FIG. 3. That is, the attenuation amount of attenuator 2 in the rising section may have a constant value. Alternatively, the input power of the high-frequency signal from attenuator 2 in the rising section may change digitally until the shift to the ALC operation section, as shown in FIG. 4. That is, the attenuation amount of attenuator 2 in the rising section may change digitally.

Further, attenuator 2 may be constituted of an analog attenuator, and the input power of the high-frequency signal from attenuator 2 in the rising section may change continuously until the shift to the ALC operation section, as shown in FIG. 5. That is, the attenuation amount of attenuator 2 in the rising section may change continuously.

It should be noted that trigger signal TRG required by oscillator 1 and controller 7 may be configured to be input from outside to oscillator 1 and controller 7, as shown in a variation of the first embodiment shown in FIG. 6.

Third Embodiment

An output power control device in accordance with a third embodiment of the present invention is described. The first embodiment and the second embodiment have each described the output power control device in which the power of the high-frequency signal is controlled to desired power from a pulse rising section, in a single pulse of the high-frequency signal. The third embodiment describes an output power control device in which power of a high-frequency signal is controlled to desired power from a pulse rising section of the high-frequency signal, in a plurality of pulse sections of the high-frequency signal.

Figure 8:
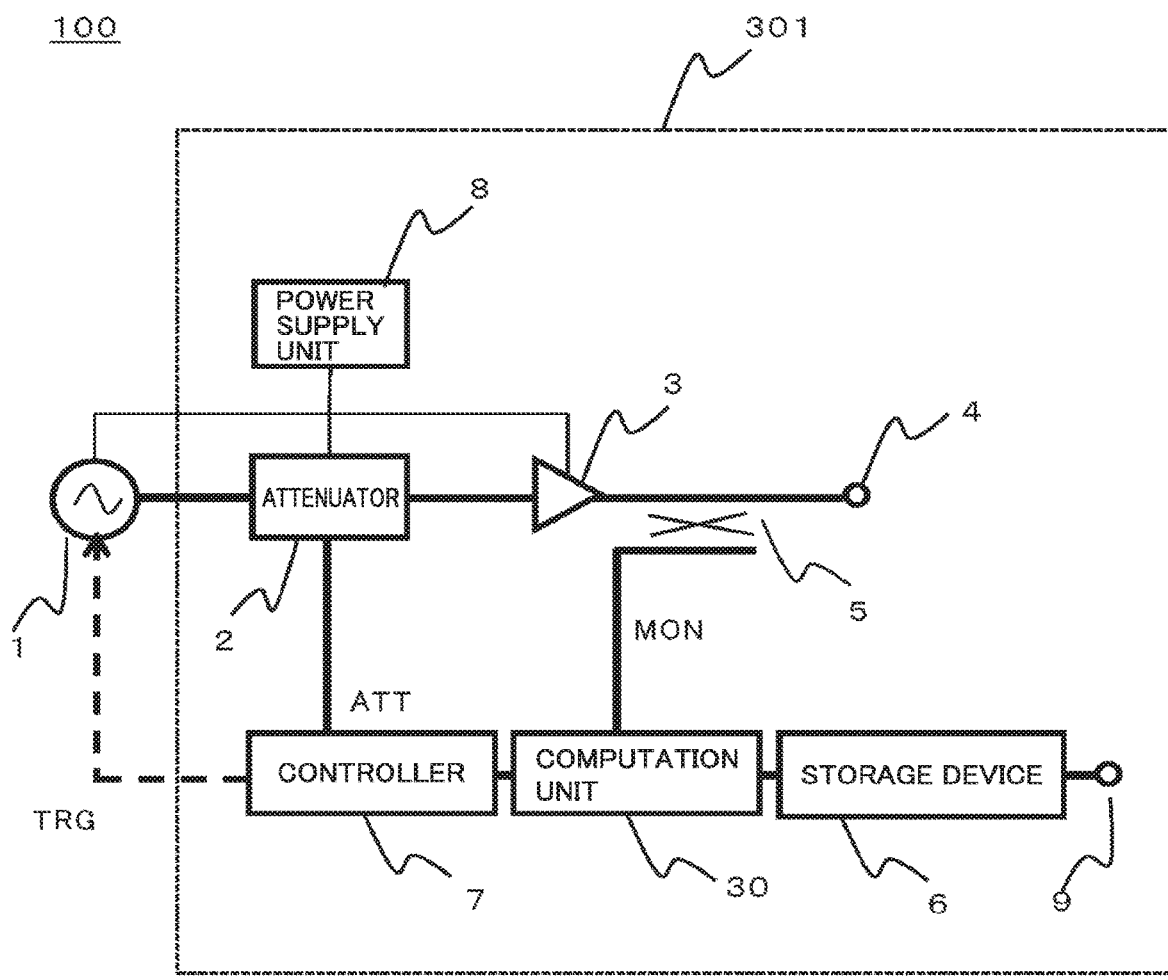
FIG. 8 is a block diagram of a transmission device including an output power control device in accordance with a third embodiment of the present invention.

FIG. 8 is a block diagram of a transmission device including the output power control device in accordance with the third embodiment of the present invention.

Transmission device 100 includes oscillator 1 and an output power control device 301. Output power control device 301 includes attenuator 2 configured to attenuate and output power of a high-frequency signal having a pulse waveform output from oscillator 1, high-frequency power amplifier 3 configured to amplify and output the power of the high-frequency signal output from attenuator 2, and monitor circuit 5 configured to monitor the power of the high-frequency signal output from high-frequency power amplifier 3 and output the high-frequency signal from output terminal 4, and also output monitor signal MON according to the magnitude of the power of the high-frequency signal. High-frequency power amplifier 3 is constituted using a semiconductor transistor made of Si, GaN, GaAs, or the like, for example. Monitor circuit 5 is constituted of a coupler and a detection diode, and outputs a voltage obtained by detecting, by the detection diode, the high-frequency signal extracted by the coupler, as monitor signal MON.

Output power control device 301 includes a computation unit 30 configured to receive monitor signal MON output from monitor circuit 5 and compute whether monitor signal MON converges to a predetermined value, and controller 7 configured to control an attenuation amount of attenuator 2 based on data of a computation result. Storage device 6 configured to store a value of the attenuation amount is connected to computation unit 30. From controller 7, trigger signal TRG for causing oscillator 1 to operate in synchronization with attenuator 2 is input to oscillator 1. It should be noted that the transmission device includes power supply unit 8 configured to provide power supply to oscillator 1, attenuator 2, and high-frequency power amplifier 3. It should be noted that storage device 6 is also referred to as a data unit.

Next, operation of transmission device 100 in a section where the high-frequency signal rises during pulse operation is described. Controller 7 generates trigger signal TRG, and transmits trigger signal TRG to oscillator 1. Oscillator 1 generates and outputs the high-frequency signal having the pulse waveform in synchronization with received trigger signal TRG. The high-frequency signal is input to attenuator 2. Then, the high-frequency signal is output from attenuator 2, input to high-frequency power amplifier 3 and subjected to high-frequency power amplification. The attenuation amount of attenuator 2 is adjusted such that the high-frequency signal output therefrom is output at desired power.

When the high-frequency signal is input to attenuator 2, since the high-frequency signal is in the rising section, it is not possible to immediately generate attenuation amount control signal ATT for attenuator 2 based on monitor signal MON output from monitor circuit 5, due to a delay caused by components such as a converter constituting monitor circuit 5 and controller 7, and computation. Accordingly, in the section where the high-frequency signal rises, controller 7 starts control of the attenuation amount of attenuator 2 by reading attenuation amount setting data calculated from output power data of an immediately preceding pulse of the high-frequency signal, obtained in the immediately preceding pulse of the high-frequency signal, stored beforehand in storage device 6, inputting the attenuation amount setting data to controller 7 to generate attenuation amount control signal ATT, and outputting attenuation amount control signal ATT to attenuator 2 in synchronization with trigger signal TRG generated by itself. The attenuation amount of attenuator 2 is adjusted based on attenuation amount control signal ATT, the high-frequency signal output from attenuator 2 is input to high-frequency power amplifier 3 and subjected to high-frequency power amplification, and the high-frequency signal to be output from high-frequency power amplifier 3 is output at the desired power. In this manner, the output power of the high-frequency signal in the rising section is controlled to desired output power.

The attenuation amount setting data is data of an attenuation amount set value which is obtained based on monitor signal MON output from monitor circuit 5 and is calculated by computation unit 30 in a section where the immediately preceding pulse of the high-frequency signal rises. This data is stored in storage device 6.

In a case where the value of monitor signal MON when controller 7 controls the attenuation amount of attenuator 2 based on the value of the attenuation amount setting data stored in storage device 6 is higher than an upper limit of an output power convergence determination range, computation unit 30 generates the attenuation amount setting data such that controller 7 generates attenuation amount control signal ATT for increasing the attenuation amount of attenuator 2 at the same timing in a subsequent pulse, and updates the attenuation amount setting data by storing the generated attenuation amount setting data in storage device 6. Conversely, in a case where the value of monitor signal MON described above is lower than a lower limit of the output power convergence determination range, computation unit 30 generates the attenuation amount setting data such that controller 7 generates attenuation amount control signal ATT for decreasing the attenuation amount of attenuator 2 at the same timing in the subsequent pulse, and updates the attenuation amount setting data by storing the generated attenuation amount setting data in storage device 6.

Then, at a timing when shift is made from a rising section where the amount of fluctuation of the output power is large, which occurs for initial several microseconds to several tens of microseconds when the high-frequency signal rises, to a stable section where the amount of fluctuation of the output power is relatively low, controller 7 switches from control of the attenuation amount of attenuator 2 based on the attenuation amount setting data calculated from the output power data of the immediately preceding pulse of the high-frequency signal, obtained in the section where the immediately preceding pulse rises, stored in storage device 6, to control of the attenuation amount of attenuator 2 by the ALC operation based on monitor signal MON. The output power of high-frequency power amplifier 3 is controlled to desired output power. It should be noted that the desired output power of the high-frequency signal controlled in the rising section is the same as the desired output power of the high-frequency signal controlled by the ALC operation.

Figure 9:
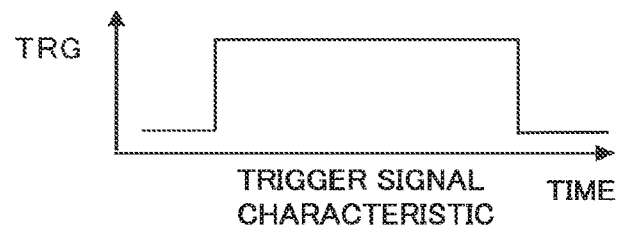
FIG. 9 is a timing chart from an oscillator to an attenuator of the transmission device in accordance with the third embodiment of the present invention.
Figure 9:
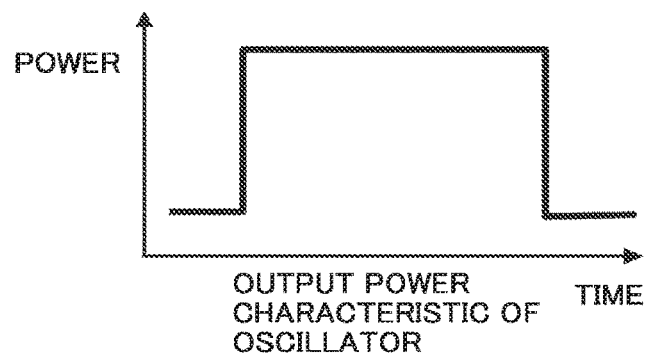
Figure 9:
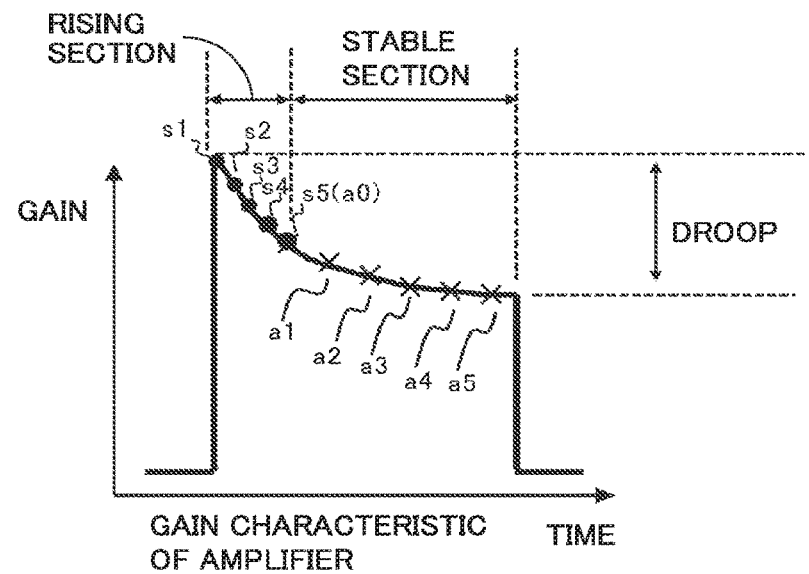
Figure 9:
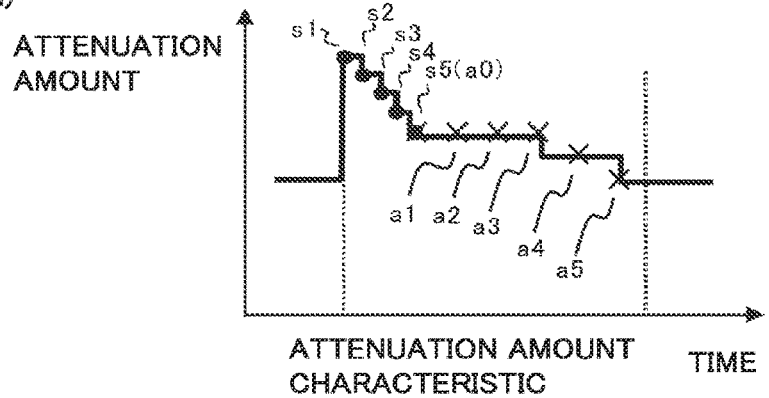

The above operation is described using the drawings. FIG. 9 is a timing chart from oscillator 1 to attenuator 2 of the transmission device in accordance with the third embodiment of the present invention.

In FIG. 9, oscillator 1 generates the high-frequency signal in synchronization with trigger signal TRG. Here, in FIGS. 9(c) and (d), s1 to s5 indicate timings in the section where the high-frequency signal rises, and a0 to a5 indicate timings in the section where the high-frequency signal is stable. Here, s5 is equal to a0. Controller 7 starts control of the attenuation amount of attenuator 2 based on the attenuation amount setting data calculated from the output power data of the immediately preceding pulse of the high-frequency signal, obtained in the section where the immediately preceding pulse of the high-frequency signal rises, stored in storage device 6, in synchronization with trigger signal TRG, and the attenuation amount of attenuator 2 shown in the rising section shown in FIG. 9 is set. From attenuator 2, the high-frequency signal having power attenuated by attenuator 2 is output. It should be noted that, since the attenuation amount of attenuator 2 in the rising section corresponds to power reduction (droop) with a large amount of fluctuation, which is caused by a change in temperature of high-frequency power amplifier 3, the interval of setting the attenuation amount indicated by s1 to s5 in the rising section is sufficiently narrower than that indicated by a0 to a5 in the stable section for the ALC operation, which is affected by a delay caused by components such as a converter constituting monitor circuit 5 and controller 7, and computation.

Since the ALC operation is performed in the stable section after the rising section, in the ALC operation section (stable section), for example, computation unit 30 generates the attenuation amount setting data based on monitor signal MON output from monitor circuit 5 at timing a0, and controller 7 generates attenuation amount control signal ATT for attenuator 2 based on the attenuation amount setting data.

However, since there occurs a delay caused by components such as a converter constituting monitor circuit 5 and controller 7 and computation, the timing at which the attenuation amount of attenuator 2 actually changes is delayed. Here, the timing at which the attenuation amount of attenuator 2 changes due to the delay is indicated by timing a1.

Figure 10:
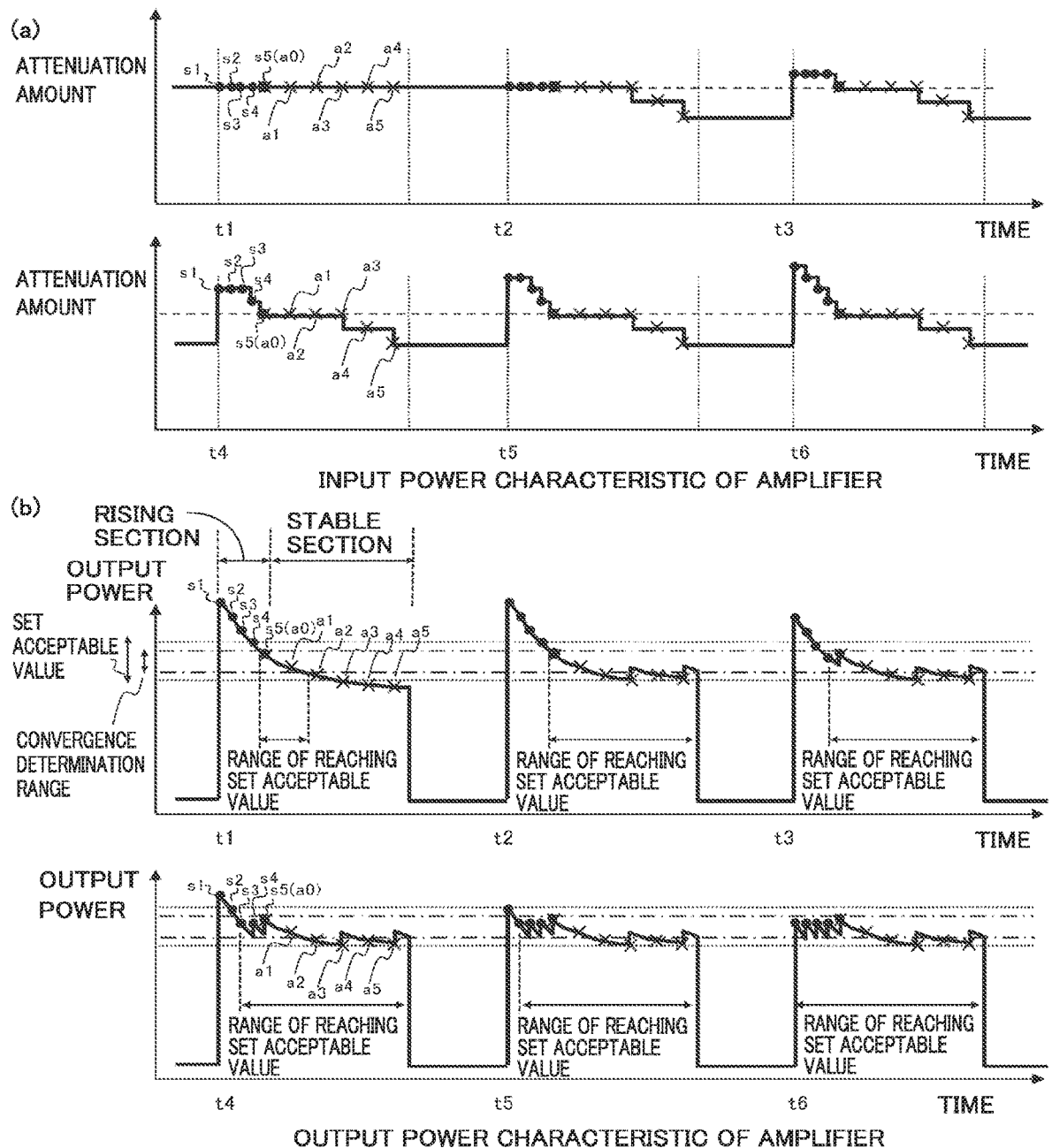
FIG. 10 is a timing chart showing an attenuation amount set value of the attenuator and output power of a high-frequency power amplifier of the transmission device in accordance with the third embodiment of the present invention.

FIG. 10 is a timing chart showing the attenuation amount set value of attenuator 2 and the output power of high-frequency power amplifier 3 of transmission device 100 in accordance with the third embodiment of the present invention.

At a time t1, an output power characteristic when the attenuation amount of attenuator 2 is constant is shown. On this occasion, the output power of the amplifier is equal to the temporal change in the gain characteristic of the amplifier. Here, s1 to s5 indicate timings in the rising section, and a0 to a5 indicate timings in the stable section. Here, s5 is equal to a0.

It should be noted that, although reference characters s1 to s5 for dot (•) marks and reference characters a0 to a5 for x marks are indicated in the section at time t1, the orders of the reference characters for dot (•) marks and x marks at each of times t2 to t6 have relations identical to those at time t1.

At time t2, there are shown setting of the attenuation amount of attenuator 2 and changes in the output power when the ALC operation is performed in the stable section where changes in the output power of the high-frequency signal decrease. In this section, since controller 7 generates attenuation amount control signal ATT for attenuator 2 based on the attenuation amount setting data generated by computation unit 30 based on monitor signal MON output from monitor circuit 5 within the same pulse of the high-frequency signal, the timing at which the attenuation amount of attenuator 2 actually changes is delayed due to a delay caused by components such as a converter constituting monitor circuit 5, computation unit 30, and controller 7, and computation. After a shift to the ALC operation, the output power within the same pulse is monitored periodically, and the attenuation amount of attenuator 2 is controlled according to that information. Thus, input power of high-frequency amplifier 3 changes.

Since this input power is input to high-frequency power amplifier 3 having a gain characteristic shown in FIG. 9, the output power of high-frequency power amplifier 3 is maintained within a set acceptable value in the stable section for the ALC operation.

At times t3 to t5, there are shown changes in the output power when control of the attenuation amount of attenuator 2 is performed based on the attenuation amount setting data calculated from the output power data of the immediately preceding pulse of the high-frequency signal, obtained in the section where the immediately preceding pulse rises, in the rising section where the output power of the high-frequency signal changes greatly. At time t3, control of the attenuation amount of attenuator 2 is performed using the attenuation amount setting data calculated from the output power data in the section at time t2. Since the output power has a value higher than the convergence determination range at s1 to s4, control is performed at t3 in a direction in which the output power decreases, that is, in a direction in which the attenuation amount of attenuator 2 increases relative to the attenuation amount setting data at time t3. Since the output power at s5 is already included in the convergence determination range, setting of the attenuation amount of attenuator 2 is not changed.

The attenuation amount setting data for attenuator 2 controlled at each of times t3 to t5 is stored in storage device 6 at each of times t3 to t5.

Then, at time t4, control of the attenuation amount of attenuator 2 is performed using the attenuation amount setting data calculated from the output power data of the high-frequency signal in the section at time t3. Since the output power has a value higher than the convergence determination range at s1 to s3, control is performed at t4 in a direction in which the output power of the high-frequency signal decreases, that is, in a direction in which the attenuation amount of attenuator 2 increases relative to the attenuation amount setting data at time t3. Since the output power at s4 and s5 is already included in the convergence determination range, setting of the attenuation amount of attenuator 2 is not changed.

By continuing the same control, the entire pulse of the high-frequency signal can be included within the set acceptable value at the timing of t6.

Figure 11:
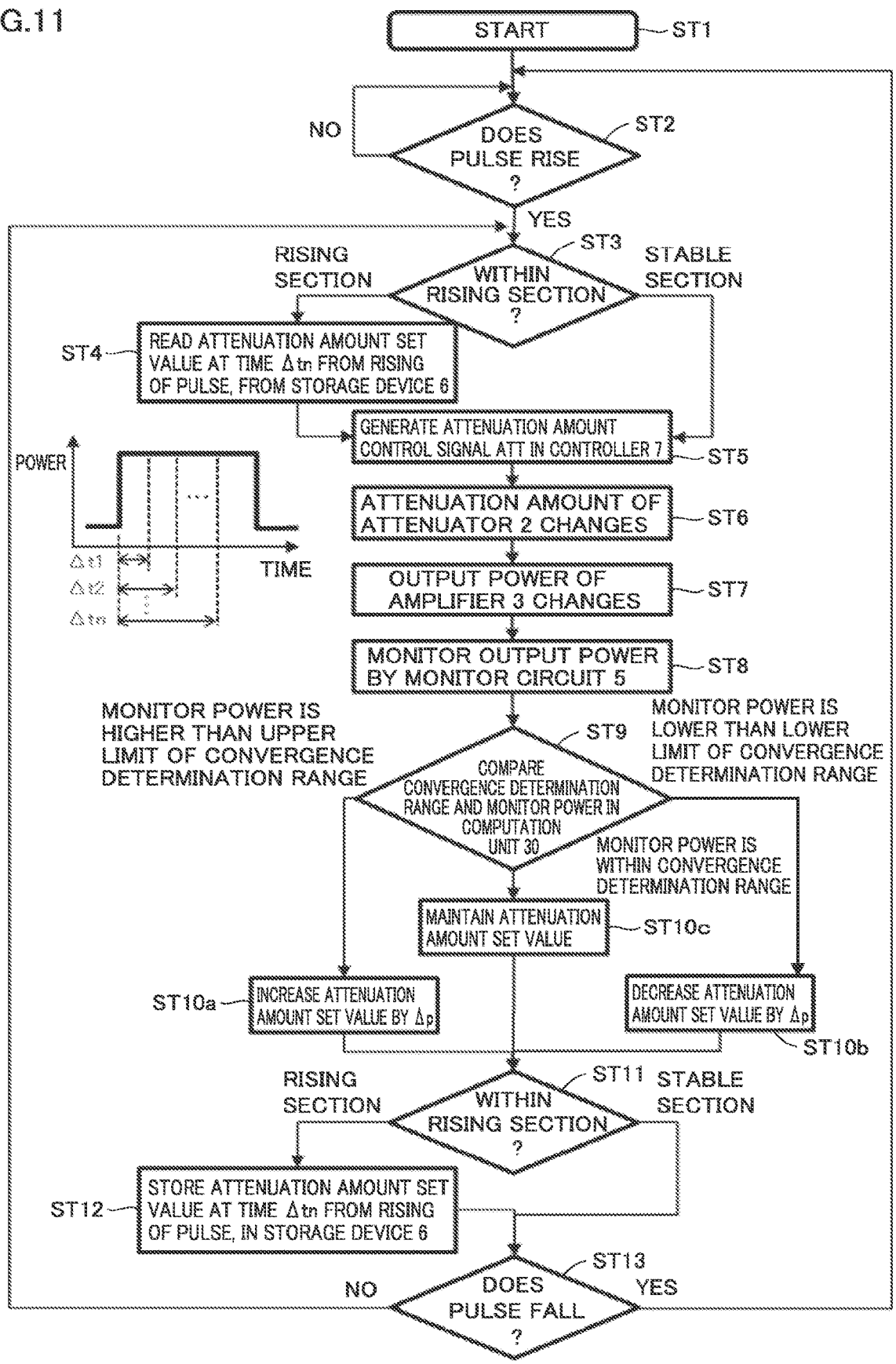
FIG. 11 is a flowchart of output power stabilization in the output power control device in accordance with the third embodiment of the present invention.

FIG. 11 shows a flowchart of output power stabilization. When operation is started in step 1 (ST1), it is determined in step 2 (ST2) whether a pulse of the high-frequency signal rises.

When it is determined in step 2 (ST2) that a pulse of the high-frequency signal rises, it is determined in step 3 (ST3) whether the present timing is within a section where the pulse rises. When it is determined in step 2 (ST2) that a pulse does not rise, the processing returns to step 2 (ST2).

When the present timing is within the section where the pulse rises in step 3 (ST3), an attenuation amount set value corresponding to the present timing is read from storage device 6 (that is, an attenuation amount set value at a time Δtn from rising of the pulse is read from storage device 6) in step 4 (ST4), and attenuation amount control signal ATT is generated in controller 7 in step 5 (ST5). When the present timing is not within the section where the pulse rises, that is, when the present timing is within a section where the pulse is stable, in step 3 (ST3), the processing proceeds to step 5 (ST5), and attenuation amount control signal ATT is generated in controller 7.

Based on attenuation amount control signal ATT generated in step 5 (ST5), the attenuation amount of attenuator 2 changes in step 6 (ST6), and according to the attenuation amount of attenuator 2 set in step 6 (ST6), the output power of the high-frequency signal of high-frequency amplifier 3 changes in step 7 (ST7). In step 8 (ST8), this output power is monitored by monitor circuit 5. The monitored result is output as monitor signal MON, and is input to computation unit 30.

In step 9 (ST9), computation unit 30 compares monitor power input as monitor signal MON and the convergence determination range of the output power of high-frequency amplifier 3. When the monitor power is higher than the upper limit of the convergence determination range as a result of comparison, computation unit 30 provides an instruction to increase the attenuation amount set value by Δp in step 10a (ST10a). When the monitor power is lower than the lower limit of the convergence determination range as a result of comparison, computation unit 30 provides an instruction to decrease the attenuation amount set value by Δp in step 10b (ST10b). When the monitor power is within the convergence determination range as a result of comparison, computation unit 30 provides an instruction to maintain the attenuation amount set value in step 10c (ST10c).

After the attenuation amount set value is controlled in step 10a to step 10c, it is determined in step 11 (ST11) whether the present timing is within the section where the pulse of the high-frequency signal rises (within the rising section), or out of the section where the pulse rises (within the stable section).

When the present timing is within the section where the pulse of the high-frequency signal rises, the attenuation amount set value instructed by computation unit 30 at the present timing is stored in storage device 6 in step 12 (ST12), and the processing proceeds to step 13 (ST13). When the present timing is out of the section where the pulse rises, the processing proceeds to step 13.

It is determined in step 13 (ST13) whether the pulse of the high-frequency signal falls at present. When the pulse falls, the processing returns to step 2 (ST2), and when the pulse does not fall (that is, the pulse is present), the processing returns to step 3 (ST3).

This operation is performed at each of s1 to s5 within the rising section and a0 to a5 out of the rising section (within the stable section).

Thus, in the third embodiment, in the section where the high-frequency signal rises, control of the attenuation amount of the attenuator is performed based on the output power data obtained in the section where the immediately preceding pulse of the high-frequency signal rises, stored in storage device 6. Accordingly, desired stable output power is obtained from high-frequency power amplifier 3 in the rising section where the output power changes greatly, including a period for shifting to the ALC operation. That is, desired stable output power is obtained from high-frequency power amplifier 3 in an entire region within the pulse of the high-frequency signal.

Figure 12:
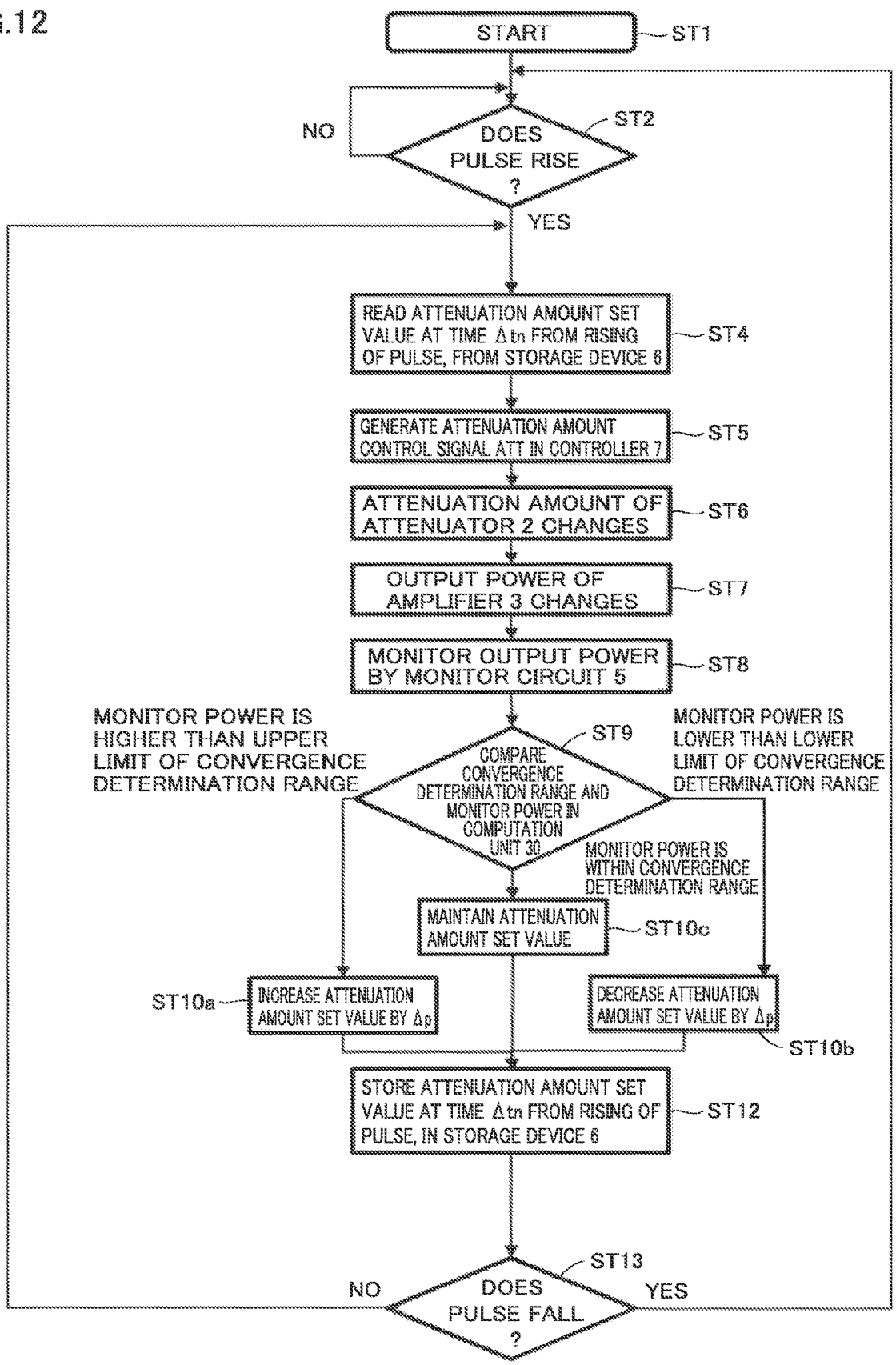
FIG. 12 is another example of the flowchart of the output power stabilization in the output power control device in accordance with the third embodiment of the present invention.

Although the ALC section (stable section) is provided in FIG. 10, control of the attenuation amount of the attenuator based on the output power data obtained in the section where the immediately preceding pulse of the high-frequency signal rises may be performed in the entire region within the pulse of the high-frequency signal. FIG. 12 shows a flowchart of output power stabilization. In FIG. 12, flows for determining whether the present timing is within the section where the pulse rises (step 3 (ST3) and step 11 (ST11)) in FIG. 11 are omitted.

Although the section where the immediately preceding pulse of the high-frequency signal rises is referred to in FIG. 10, the state of a further preceding pulse may be referred to, instead of the immediately preceding pulse.

Figure 13:
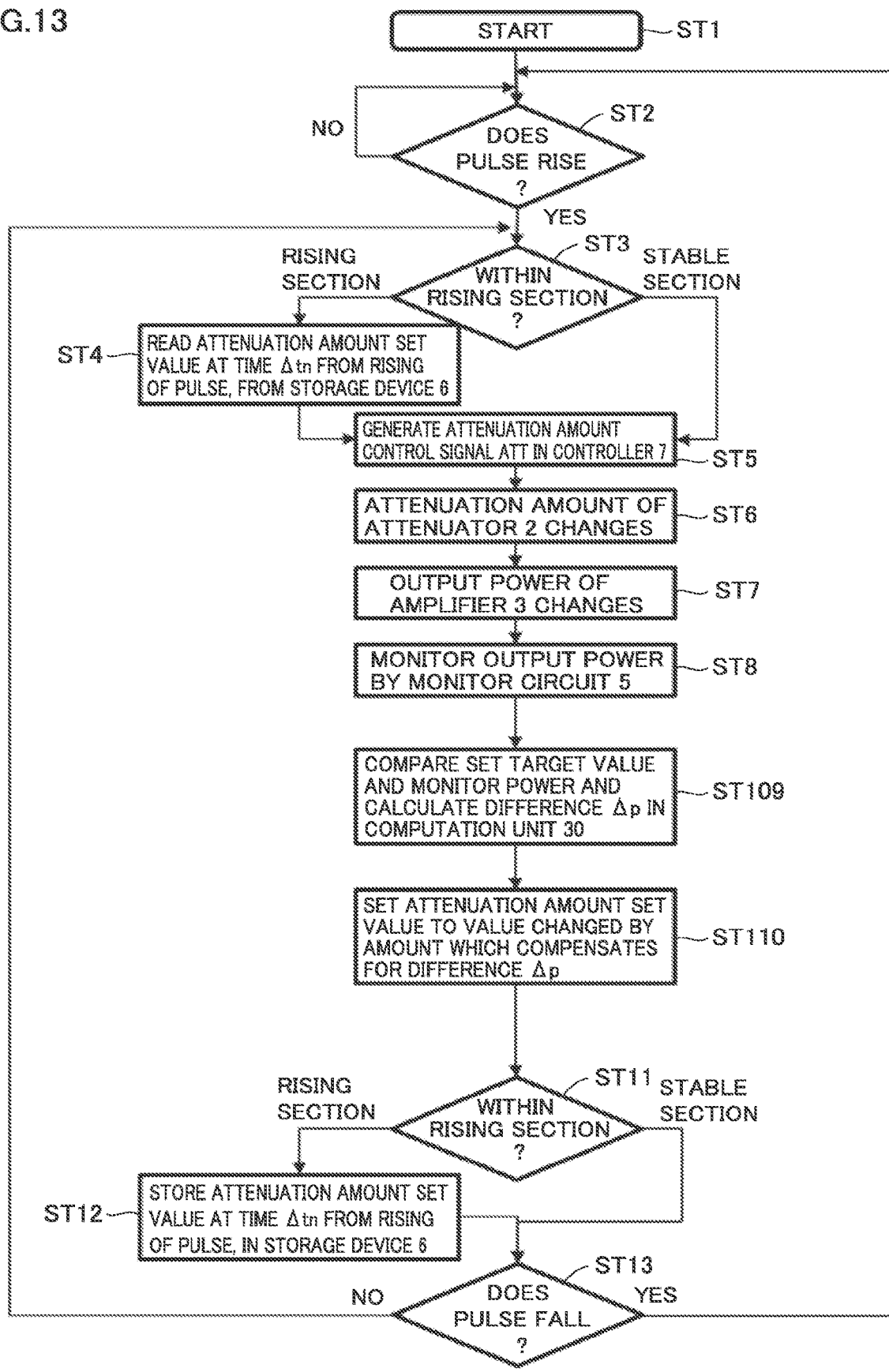
FIG. 13 is another example of the flowchart of the output power stabilization in the output power control device in accordance with the third embodiment of the present invention.

The operation in the flowchart of the output power stabilization in FIG. 11 may be changed as shown in FIG. 13. Specifically, computation unit 30 may compare a set target value and the monitor power and calculate a difference Δp as in step 109 (ST109), instead of step 9 (ST9), and provide an instruction to set the attenuation amount set value to a value changed by an amount which compensates for difference Δp as in step 110 (ST110), instead of steps 10a, 10b, and 10c (ST10a, ST10b, ST10c).

Figure 14:
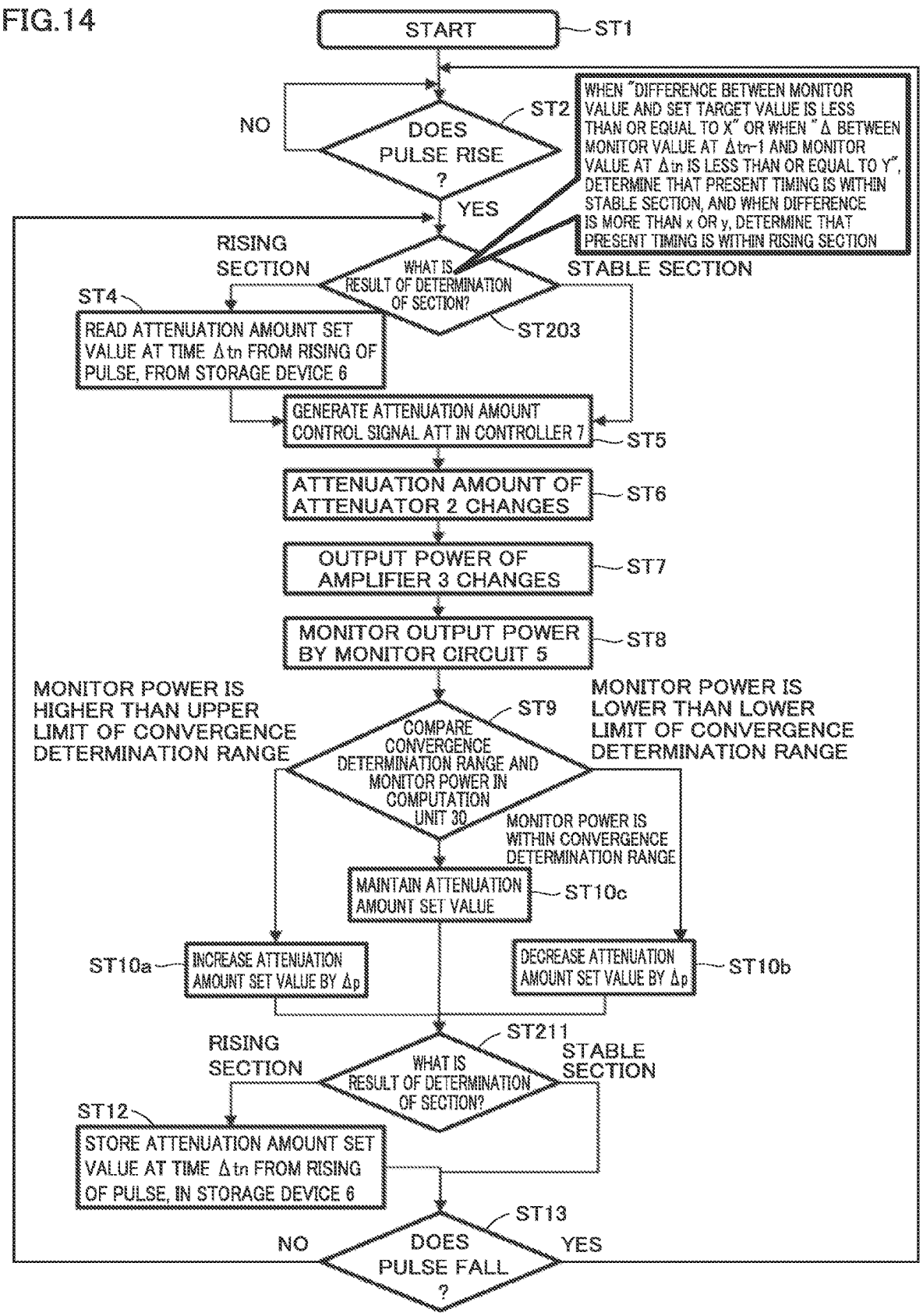
FIG. 14 is another example of the flowchart of the output power stabilization in the output power control device in accordance with the third embodiment of the present invention.

The operation in the flowchart of the output power stabilization in FIG. 11 may be changed as shown in FIG. 14. Specifically, determination of the section may be performed based on comparison of the monitor power, as in step 203 (ST203) instead of step 3 (ST3), and as in step 211 (ST211) instead of step 11 (ST11). In the steps of determining the section, when "the difference between the monitor power and the set target value is less than or equal to a predetermined value" or when "the difference between monitor power at a timing immediately preceding the present timing and monitor power at the present timing is less than or equal to a predetermined value", it is determined that the present timing is within the stable section, and when "the difference between the monitor power and the set target value is more than or equal to the predetermined value" or when "the difference between the monitor power at the timing immediately preceding the present timing and the monitor power at the present timing is more than or equal to the predetermined value", it is determined that the present timing is within the rising section.

Figure 15:
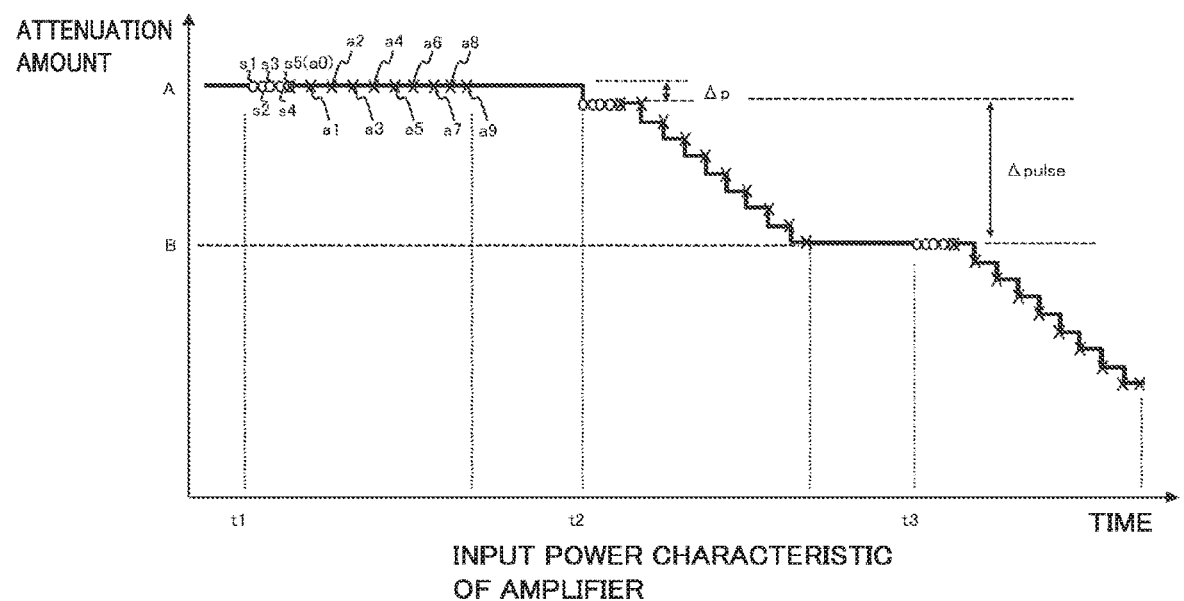
FIG. 15 is another example of the timing chart showing the attenuation amount set value of the attenuator and the output power of the high-frequency power amplifier of the transmission device in accordance with the third embodiment of the present invention.
Figure 15:
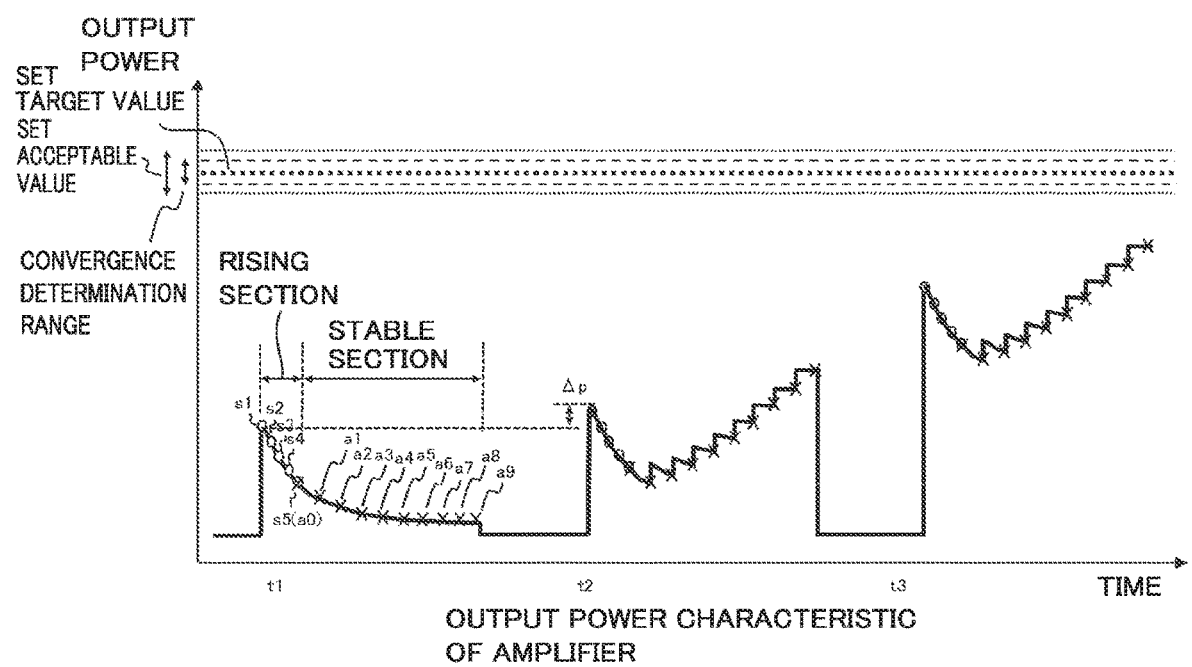

FIG. 15 is also one of timing charts showing the attenuation amount set value of attenuator 2 and the output power of high-frequency power amplifier 3 of transmission device 100 in accordance with the third embodiment of the present invention.

When it is not desired to overshoot the output power of amplifier 3 relative to a set target value, the entire pulse of the output power can be set to a value lower than the set target value as shown in FIG. 15(b) at time t1, by increasing an initial attenuation amount set value as shown in FIG. 15(a) at time t1.

In addition, at time t1, an output power characteristic when the attenuation amount of attenuator 2 is constant is shown. On this occasion, the output power of the amplifier is equal to the temporal change in the gain characteristic of the amplifier. Here, s1 to s5 indicate timings in a rising section, and a0 to a9 indicate timings in a stable section. Here, s5 is equal to a0.

It should be noted that, although reference characters s1 to s5 for dot (•) marks and reference characters a0 to a5 for x marks are indicated in the section at time t1, the orders of the reference characters for dot (•) marks and x marks at each of times t2 to t3 have relations identical to those at time t1.

Since the output power is lower than a set acceptable value at all timings in time t1, a set value is stored in storage device 6 to decrease the attenuation amount set value by Δp at s1 to s5 in the rising section. Thus, in time t2, the attenuation amount set value is decreased by Δp at each of s1 to s5 in the rising section. Further, in the stable section where changes in the output power decrease, the ALC operation is performed. In this section, since attenuation amount control signal ATT for attenuator 2 is generated based on monitor signal MON output from monitor circuit 5 within the same pulse, the timing at which the attenuation amount of attenuator 2 actually changes is delayed due to a delay caused by components such as a converter constituting monitor circuit 5 and controller 7, and computation. After a shift to the ALC operation, the output power within the same pulse is monitored periodically, and the attenuation amount of attenuator 2 is controlled according to that information. Thus, input power of high-frequency amplifier 3 changes.

In FIG. 10, controller 7 calculates the attenuation amount setting data increased or decreased by Δp shown in the flowchart of FIG. 11, from the output power data of the immediately preceding pulse, obtained in the section where the immediately preceding pulse rises, stored in storage device 6, and determines control of the attenuation amount of attenuator 2 in the subsequent pulse based on that data. However, in FIG. 15, until the output power reaches the set acceptable value, the last attenuation amount set value of the immediately preceding pulse is used. Thereby, an amount of change Δpulse is obtained, whose absolute value of the amount of change from the output power at the same timing in the immediately preceding pulse is greater than that of Δp. Accordingly, in comparison with the case of merely adding Δp to the output power data of the immediately preceding pulse, control of the output power of the subsequent pulse can be started from a value closer to the lower limit of the convergence determination range.

In this manner, it is possible to bring the output power closer to the set target value faster, not only by referring to the output power data at the same timing in the immediately preceding pulse of the high-frequency signal, but also by reflecting the last attenuation amount set value of the immediately preceding pulse, which is closer to the lower limit of the convergence determination range, to an attenuation amount set value of the subsequent pulse, by the ALC operation.

The attenuation amount set value in the rising section at time t1 may be arbitrarily provided with an offset amount according to the form in which the pulse rises, such that the output power does not exceed the set acceptable value as much as possible. Similarly, Δpulse calculated by adding Δp to the last attenuation amount set value of the immediately preceding pulse may also be provided with an offset amount as necessary.

Figure 16:
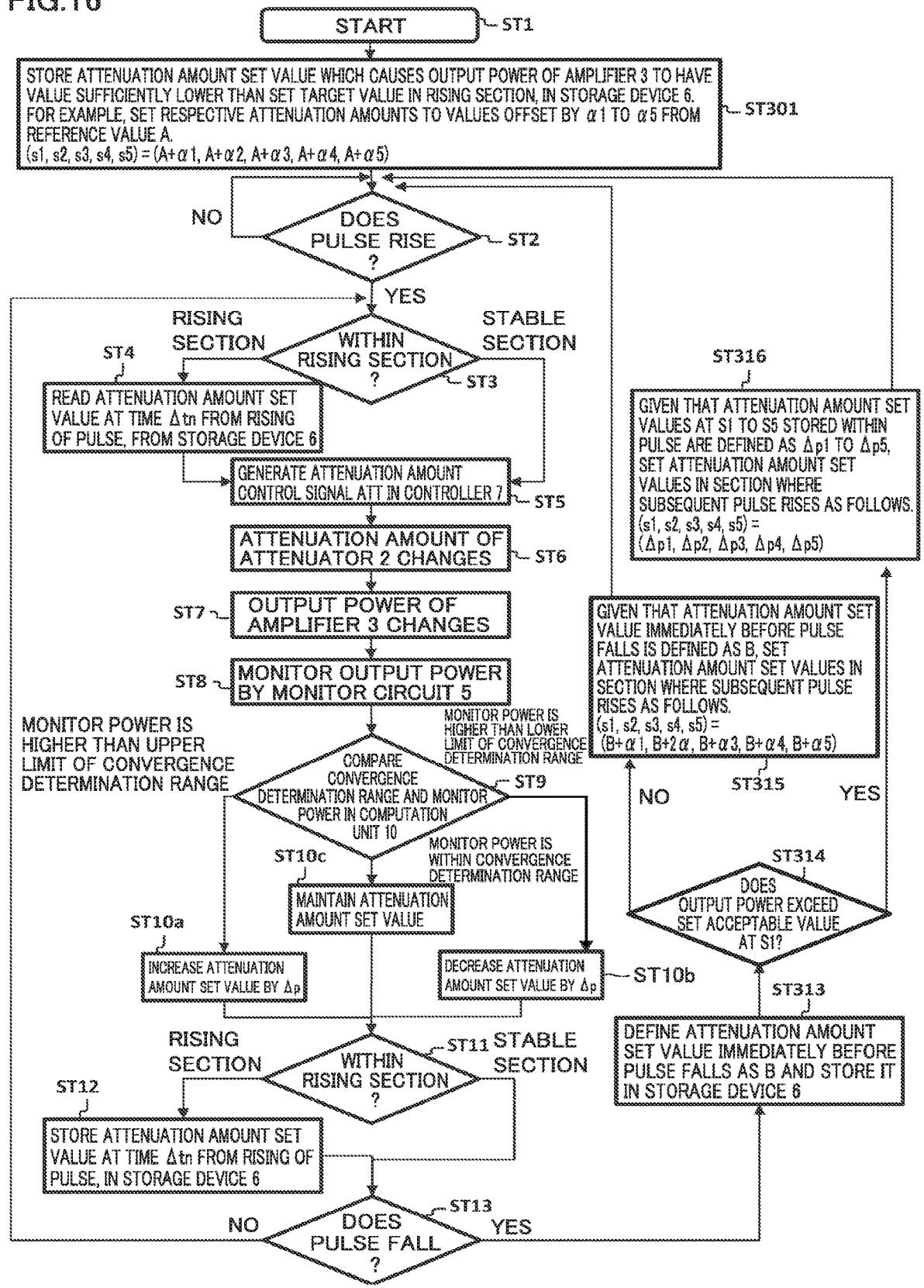
FIG. 16 is a flowchart of output power stabilization in the output power control device in FIG. 15.

FIG. 16 shows a flowchart of output power stabilization. When operation is started in step 1 (ST1), it is determined whether a pulse rises. In step 301 (ST301), an attenuation amount set value which causes the output power of amplifier 3 to have a value sufficiently lower than a set target value in a rising section is stored in storage device 6. For example, the value is set such that, at s1 to s5, respective attenuation amounts have values which are offset by a1 to a5 from a reference value A which causes the entire pulse of the output power to have a value lower than the set target value, as follows.

$$(s1,s2,s3,s4,s5)=(A+\alpha 1,A+\alpha 2,A+\alpha 3,A+\alpha 4,A+\alpha 5)$$

Then, it is determined in step 2 (ST2) whether a pulse rises. When a pulse rises, it is determined whether the present timing is within a section where the pulse rises. Since the operation performed thereafter until the pulse falls is the same as that in FIG. 11, the description thereof is omitted.

When the pulse falls in step 13 (ST13), an attenuation amount set value immediately before the pulse falls is stored in storage device 6 as B in step 313 (ST313). Given that attenuation amount set values at s1 to s5 stored within the pulse are defined as Δp1 to Δp5, it is determined in step 314 (ST314) whether the output power exceeds a set acceptable value at s1, for example. Until the output power exceeds the set acceptable value, attenuation amount set values in a section where a subsequent pulse rises are set in step 315 (ST315) as follows.

$$(s1,s2,s3,s4,s5)=(B+\alpha 1,B+\alpha 2,B+\alpha 3,B+\alpha 4,B+\alpha 5)$$

When the output power exceeds the set acceptable value, the attenuation amount set values in the section where the subsequent pulse rises are set in step 316 (ST316) as follows.

$$(s1,s2,s3,s4,s5)=(\Delta p1,\Delta p2,\Delta p3,\Delta p4,\Delta p5)$$

Thereafter, the processing returns to step 2 (ST2).

In this manner, it is possible to bring the output power closer to the set target value faster, not only by referring to the output power data at the same timing in the immediately preceding pulse, but also by reflecting the last attenuation amount set value of the immediately preceding pulse, which is closer to the lower limit of the convergence determination range, to the attenuation amount set value of the subsequent pulse, by the ALC operation.

In FIGS. 15 and 16, the description has been given of the case where the entire pulse of the output power at t1 has a value lower than the set target value. Conversely, when it is not desired to reduce the output power from the set target value too much, setting of attenuator 2 may be changed to start control from a state where the entire pulse of the output power at t1 has a value higher than the set target value.

Figure 17:
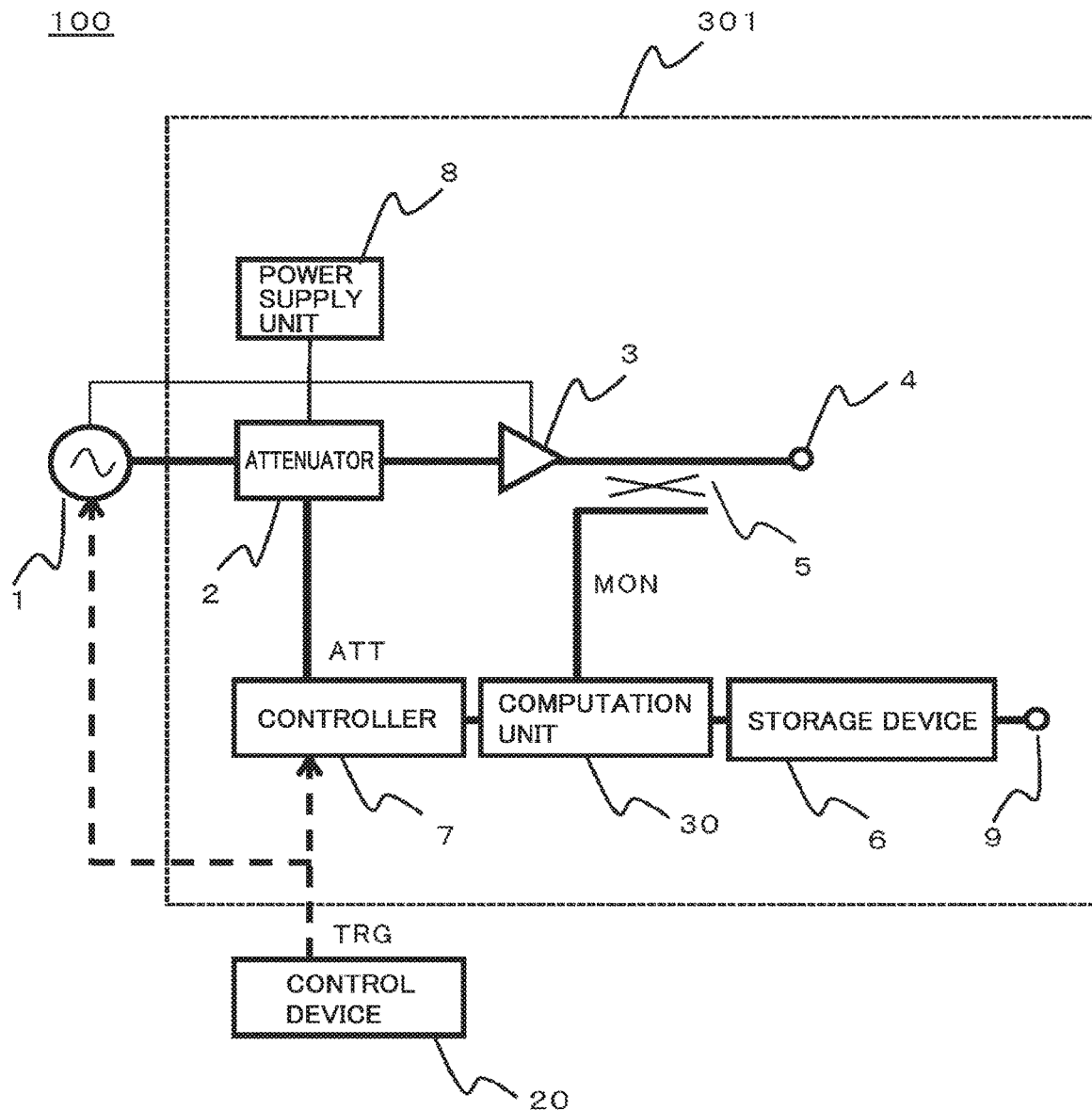
FIG. 17 is a block diagram of a variation of the transmission device including the output power control device in accordance with the third embodiment of the present invention.

The third embodiment has described an example in which trigger signal TRG is generated by controller 7. Trigger signal TRG required by oscillator 1 and controller 7 may be configured to be input from external control device 20 or the like to oscillator 1 and controller 7, as shown in FIG. 17. In this case, oscillator 1 generates and outputs the high-frequency signal having the pulse waveform in synchronization with trigger signal TRG input from outside. Controller 7 starts control of the attenuation amount of attenuator 2 based on the attenuation amount setting table stored in storage device 6, in synchronization with trigger signal TRG input from the outside.

In the first to third embodiments, adjustment of the output power is performed using attenuator 2. In a case where it is not desired to reduce the gain of transmission device 100, adjustment of the output power may be performed using a variable gain amplifier, instead of attenuator 2.

In FIGS. 13 and 16, a convergence time is shortened by changing setting of the attenuator by Δp, which is the difference between the set target value and the monitor power, or using attenuation amount set value B immediately before the pulse falls. However, the amount of change of the set value for the attenuator to be changed at once may be changed according to the difference between the set target value and the monitor power.

Figure 18:
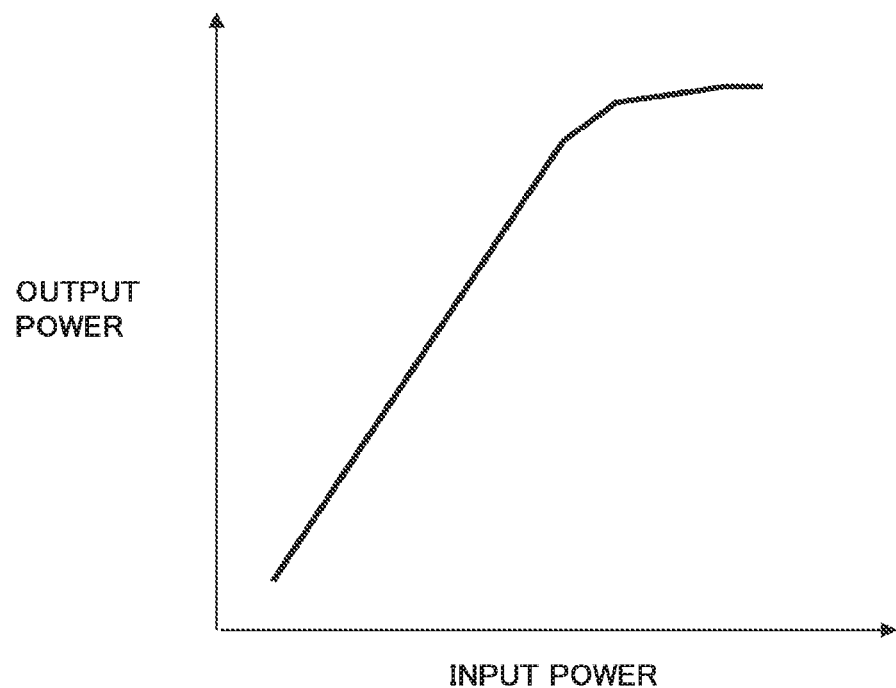
FIG. 18 is a diagram showing input/output characteristics of a common high-frequency power amplifier.

In addition, as shown in FIG. 18, since the output power of the high-frequency power amplifier is generally saturated, as the input power increases, that is, as the output power increases, gain, which is a difference therebetween, tends to decrease. Thus, as the set target value of the output power increases, the amount of change of the set value for the attenuator to be changed at once may be increased, for example.

REFERENCE SIGNS LIST

1: oscillator; 2: attenuator; 3: high-frequency power amplifier; 4: output terminal; 5: monitor circuit; 6: storage device; 7: controller; 8: power supply unit; 9: input terminal; 10: computation device; 20: control device; 30: computation unit; 100: transmission device; 101: output power control device; 201: output power control device; 301: output power control device.

The invention claimed is:

1. An output power control device comprising:
   an attenuator to attenuate and output power of a high-frequency signal having a pulse waveform output from an oscillator;
   a high-frequency power amplifier to amplify and output the power of the high-frequency signal output from the attenuator;
   a monitor circuit to monitor the power of the high-frequency signal output from the high-frequency power amplifier, and output a monitor signal according to magnitude of the power of the high-frequency signal; and
   a controller to control an attenuation amount of the attenuator based on the monitor signal output from the monitor circuit or based on attenuation amount setting data from a data unit, wherein
   the oscillator generates the high-frequency signal having the pulse waveform in synchronization with a trigger signal,
   the controller starts control of the attenuation amount of the attenuator using an attenuation amount control signal generated based on the attenuation amount setting data, in synchronization with the trigger signal, and
   after receiving the monitor signal, the controller controls the attenuation amount of the attenuator using the attenuation amount control signal generated based on the monitor signal.

2. The output power control device according to claim 1, wherein the controller generates the trigger signal, transmit the trigger signal to the oscillator, and causes the oscillator to generate the high-frequency signal in synchronization with the trigger signal.

3. The output power control device according to claim 1, wherein the oscillator generates the high-frequency signal in synchronization with the trigger signal input from outside, and the controller starts control of the attenuation amount of the attenuator using the attenuation amount control signal generated based on the attenuation amount setting data, in synchronization with the trigger signal input from the outside.

4. The output power control device according to claim 1, wherein the data unit is a storage device to store beforehand the attenuation amount setting data determined based on a characteristic of the high-frequency power amplifier.

5. The output power control device according to claim 1, wherein the data unit is a computation circuitry to compute and generate the attenuation amount setting data based on an input operation condition of the high-frequency power amplifier.

6. The output power control device according to claim 1, wherein the attenuation amount setting data causes the controller to generate the attenuation amount control signal having a constant value.

7. The output power control device according to claim 1, wherein the attenuation amount setting data causes the controller to generate the attenuation amount control signal which changes digitally.

8. The output power control device according to claim 1, wherein the attenuation amount setting data causes the controller to generate the attenuation amount control signal which changes continuously.

9. The output power control device according to claim 1, further comprising a computation circuitry to receive the monitor signal and arranged between the controller and the data unit, wherein
   the computation circuitry inputs the attenuation amount setting data saved in the data unit to the controller, as the attenuation amount setting data for a pulse waveform section in which the high-frequency signal having the pulse waveform is output from the oscillator, and
   based on the monitor signal obtained by being controlled based on the attenuation amount setting data in the pulse waveform section, the computation circuitry generates the attenuation amount setting data for the pulse waveform section, updates the attenuation amount setting data as the attenuation amount setting data for a subsequent pulse waveform section, and saves the attenuation amount setting data in the data unit.

10. The output power control device according to claim 9, wherein
    within the pulse waveform section, for a predetermined time from start of a pulse, the controller controls the attenuation amount of the attenuator using the attenuation amount control signal generated based on the attenuation amount setting data, and
    after the predetermined time has elapsed, the controller controls the attenuation amount of the attenuator using the attenuation amount control signal generated based on the monitor signal received via the computation circuitry.

* * * * *